(12) United States Patent
Ghiasi

(10) Patent No.: US 7,257,154 B2
(45) Date of Patent: Aug. 14, 2007

(54) MULTIPLE HIGH-SPEED BIT STREAM INTERFACE CIRCUIT

(75) Inventor: Ali Ghiasi, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 769 days.

(21) Appl. No.: 10/625,438

(22) Filed: Jul. 23, 2003

(65) Prior Publication Data

US 2004/0131058 A1 Jul. 8, 2004

Related U.S. Application Data

(60) Provisional application No. 60/398,741, filed on Jul. 26, 2002, provisional application No. 60/397,599, filed on Jul. 22, 2002.

(51) Int. Cl.
*H04L 5/16* (2006.01)
(52) U.S. Cl. ...................................... 375/220
(58) Field of Classification Search ........ 375/219–223, 375/257; 370/419, 420, 535–537
See application file for complete search history.

(56) References Cited

U.S. PATENT DOCUMENTS

| 4,121,217 | A | * | 10/1978 | Chen ........................... 370/535 |
| 4,703,471 | A |   | 10/1987 | Fitelson et al. |
| 5,040,170 | A | * | 8/1991 | Upp et al. ..................... 398/50 |

| 2001/0053146 | A1 | * | 12/2001 | Lyon et al. .................. 370/359 |
| 2003/0035445 | A1 | * | 2/2003 | Choi ........................... 370/535 |

FOREIGN PATENT DOCUMENTS

| EP | 0 928 088 A2 | 7/1999 |
| WO | WO 02/32005 A1 | 4/2002 |

OTHER PUBLICATIONS

Chen, Walter Y. "A Direct Equalization Method", 1997 IEEE International Conference on Acoustics, Speech and Signal Processing. Speech Processing, Digital Signal Processing. Munich, vol. 3, Apr. 21, 1997-Apr. 24, 1997, pp. 2505-2508, XP000735068; IEEE, New York, NY, USA; ISBN: 0-8186-7920-4.

* cited by examiner

*Primary Examiner*—Don N. Vo
(74) *Attorney, Agent, or Firm*—Garlick Harrison & Markison; Bruce Garlick; Kevin L. Smith

(57) ABSTRACT

A high-speed bit stream interface module interfaces a high-speed communication media to a communication Application Specific Integrated Circuit (ASIC) via a Printed Circuit Board (PCB) or the communication ASIC to another communication ASIC. The high-speed bit stream interface includes a line side interface, a board side interface, and a plurality of signal conditioning circuits. The signal conditioning circuits service each of an RX path and a TX path and include a limiting amplifier and a clock and data recovery circuit. The signal conditioning circuit may also include an equalizer and/or an output pre-emphasis circuit. The clock and data recovery circuit has an adjustable Phase Locked Loop (PLL) bandwidth that is set to correspond to a jitter bandwidth of a serviced high-speed bit stream.

24 Claims, 36 Drawing Sheets

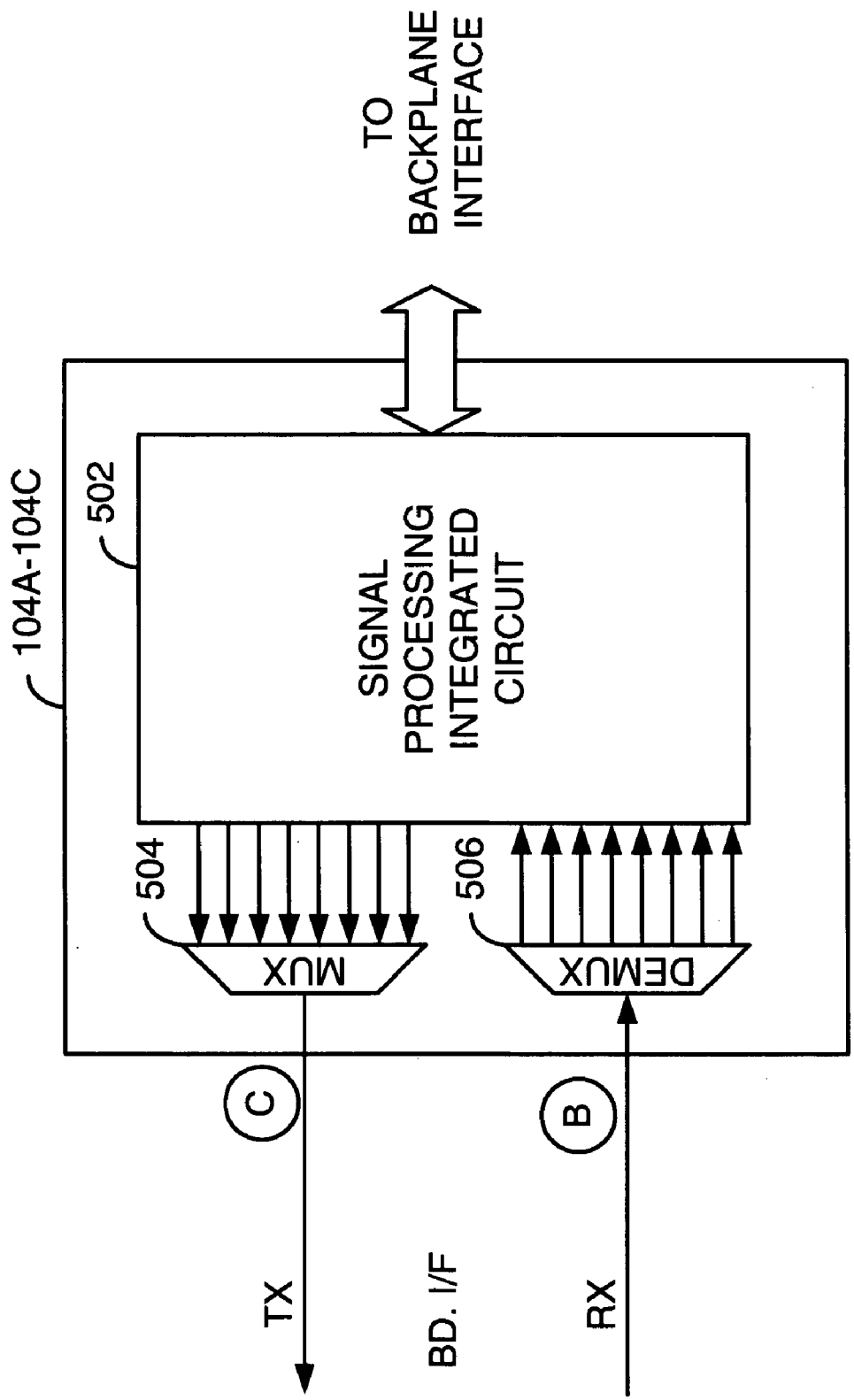

| Parameter (Transmitter) | Symbol | Conditions | Min | Typ | Max | Units |
|---|---|---|---|---|---|---|
| Single Ended Output Impedance | $Z_{SE}$ | | 40 | 50 | 60 | Ω |
| Differential Output Impedance | $Z_d$ | | 80 | 100 | 120 | Ω |
| Output Impedance Match | $Z_M$ | | | | 10 | % |
| CML output Amplitude, Diff., p-p | $\Delta VQDO$ | | | 500 | 600 | mV |
| Output Rise and Fall time (20% to 80%) | $t_{RH}, t_{FH}$ | | 24 | 28 | 40 | ps |
| Differential output return loss up | S11 | Up to 7.5 GHz | | | -10 | dB |
| | | 7.5-15 GHz | | | * | dB |
| Single Ended output return loss | S11 | Up to 15 GHz | | | -6 | dB |

* $RL = -10 + 16.6 \, Log(f/7.5)$

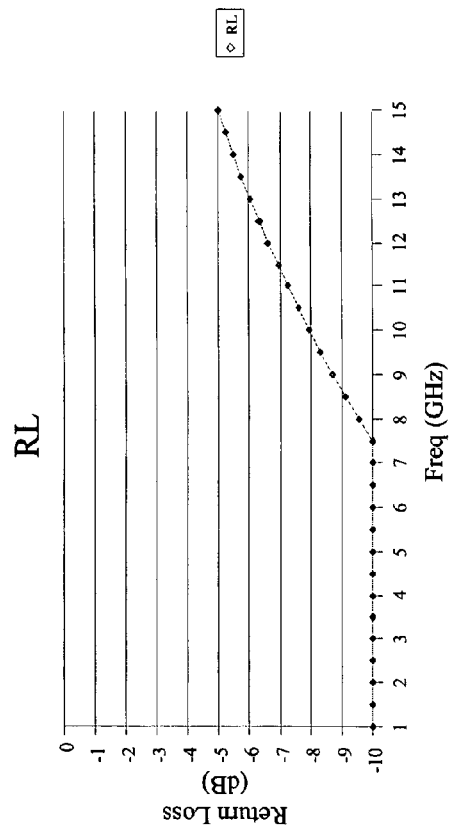

FIG. 5C

| Parameter (Transmitter) | Symbol | Conditions | Min | Typ | Max | Units |
|---|---|---|---|---|---|---|
| Nominal Bit Rate | f | | 9.95 | | 10.75 | GHz |
| Determinstic Jitter | DJ | MJS/802.3ae | | 0.12 | 0.15 | UI |
| Random Jitter | RJ | MJS/802.3ae | | 0.13 | 0.15 | UI |
| Eye Mask | X1 | | | | 0.15 | UI |
| Eye Mask | X2 | | | | 0.4 | UI |
| Eye Mask | Y1 | | | | 200 | mV |
| Eye Mask | Y2 | | | | 300 | mV |
| SOENT Jitter (RMS) | | Up to 80 MHz | | | 10 | mU |

| Parameter (Receiver) | Symbol | Conditions | Min | Typ | Max | Units |
|---|---|---|---|---|---|---|
| Single Ended Input Impedance | $Z_{SE}$ | | 40 | 50 | 60 | Ω |
| Differential Input impedance | $Z_d$ | | 80 | 100 | 120 | Ω |
| Input Impedance Match | $Z_M$ | | | | 10 | % |
| CML Input Differential Ampl., p-p | ΔVQDO | | 125 | | 1000 | mV |
| Differential Input Return Loss | S22 | Up to 7.5 GHz | | | -10 | dB |
| | | 7.5-15 GHz | | | *1 | dB |
| Single Ended Input Return Loss | S22 | Up to 15 GHz | | | -5 | dB |

1. RL=10 - 16.6 Log(f/7.5)
2. Single ended return loss is nessary for EMI.

| Parameter (Receiver) | Symbol | Conditions | Min | Typ | Max | Units |
|---|---|---|---|---|---|---|
| Nominal Bit Rate | f | | 9.95 | | 10.75 | GHz |
| Determinstic Jitter * | DJ | MJS/802.3ae | | 0.35 | 0.55 | UI |
| Random Jitter | RJ | MJS/802.3ae | | 0.18 | 0.2 | UI |
| Eye Mask | X1 | | | | 0.35 | UI |
| Eye Mask | Y1 | | | | 62.5 | mV |
| Eye Mask | Y2 | | | | 500 | mV |
| SOENT Jitter | | Up to 80 MHz | | | 30 | mU |

* 0.25 UI of DJ is allocated to ISI from 8" of FR4 PCB trace.

MULTIPLE HIGH-SPEED BIT STREAM INTERFACE CIRCUIT

CROSS REFERENCE TO RELATED APPLICATION

This application claims priority to U.S. Provisional Application Ser. No. 60/397,599, filed Jul. 22, 2002, to U.S. Provisional Application Ser. No. 60/398,741, filed Jul. 26, 2002, to U.S. Regular Utility Application Ser. No. 10/390,495, filed Mar. 17, 2003, to U.S. Regular Utility application Ser. No. 10/393,613, filed Mar. 21, 2003, to U.S. Regular Utility application Ser. No. 10/418,009, filed Apr. 17, 2003, and to U.S. Regular Utility application Ser. No. 10/418,035, filed Apr. 17, 2003, all of which are incorporated herein by reference in their entirety for all purposes.

BACKGROUND OF THE INVENTION

1. Technical Field of the Invention

The present invention relates generally to communication systems; and more particularly to high-speed serial bit stream communications.

2. Description of Related Art

The structure and operation of communication systems is generally well known. Communication systems support the transfer of information from one location to another location. Early examples of communication systems included the telegraph and the public switch telephone network (PSTN). When initially constructed, the PSTN was a circuit switched network that supported only analog voice communications. As the PSTN advanced in its structure and operation, it supported digital communications. The Internet is a more recently developed communication system that supports digital communications. As contrasted to the PSTN, the Internet is a packet switch network.

The Internet consists of a plurality of switch hubs and digital communication lines that interconnect the switch hubs. Many of the digital communication lines of the Internet are serviced via fiber optic cables (media). Fiber optic media supports high-speed communications and provides substantial bandwidth, as compared to copper media. At the switch hubs, switching equipment is used to switch data communications between digital communication lines. WANs, Internet service providers (ISPs), and various other networks access the Internet at these switch hubs.

In a particular example of a packet switched network, a switch that services the digital communication requirements of a number of users located within a building in a large city couples via fiber media to switches mounted in other buildings within the city, to switches located in other cities/states/countries, and to switch hubs servicing the Internet. This structure is not unique to the Internet. Portions of the PSTN, wireless cellular network infrastructure, Wide Area Networks (WANs), and other communication systems employ the same or similar structures.

Switches route incoming traffic and outgoing traffic. A typical switch (or switch hub) includes a housing having a plurality of slots that are designed to receive Printed Circuit Boards (PCBs) upon which integrated circuits and various media connectors are mounted. The PCBs removably mount within the racks of the housing and typically communicate with one another via a back plane of the housing. Each PCB typically includes at least two media connectors that couple the PCB to a pair of optical cables and/or copper media. The optical and/or copper media serves to couple the PCB to other PCBs of other switches located in the same geographic area or to other PCBs of other switches located at another geographic area.

Typically, Application Specific Integrated Circuits (ASICs) mount upon the PCBs of the housing and perform switching operations for the data that is received on the coupled media and data that is transmitted on the coupled media. The coupled media typically terminates in a receptacle mounted on the PCB. Transceiving circuitry coupled to the receptacle and mounted upon the PCB performs signal conversion operations from the signal format of the coupled media and a bit stream format of the ASIC. In most installations, the media, e.g., optical media, operates in a simplex fashion. In such case, one optical media will carries incoming data (RX data) to the PCB while another optical media carries outgoing data (TX data) from the PCB. Thus, the transceiving circuitry typically includes incoming circuitry and outgoing circuitry, each of which couples to a media connector on a first side and communicatively couples to the ASIC on a second side. The ASIC may also couple to a back plane interface that allows the ASIC to communicate with other ASICs located in the enclosure via a back plane connection. The ASIC is designed and implemented to provide desired switching operations. The operation of such enclosures and the PCBs mounted therein is generally known.

The conversion of information on the optical media or copper media to a signal that may be received by the ASIC and vice versa requires satisfaction of a number of requirements. First, the coupled physical media has particular RX signal requirements and TX signal requirements. These requirements must be met at the boundary of the connector to the physical media. Further, the ASIC has its own unique RX and TX signal requirements. These requirements must be met at the ASIC interface. Thus, the transceiving circuit that resides between the physical media and the ASIC must satisfy all of these requirements.

Various standardized interfaces have been employed to couple the transceiving circuit to the ASIC. These standardized interfaces include the XAUI interface, the Xenpak interface, the GBIC interface, the XGMII interface, and the 300 Pin MSA interface. Each of these particular standardized interfaces has unique requirements and related shortcomings. Generally, each of these interfaces requires substantial PCB board space and some of these interfaces supports a lesser throughput than is required by many current systems. Further, each of these interfaces is not typically practical for high-speed back plane interface linkage of high-speed circuits.

Thus, there is a need in the art for low cost universal interface that interfaces an ASIC to a high-speed serial media on a printed circuit board.

BRIEF SUMMARY OF THE INVENTION

Thus, in order to overcome the shortcomings of the prior interfaces, among other shortcomings, a high-speed bit stream interface module constructed according to the present invention communicatively services high-speed bit streams. A first embodiment of the high-speed bit stream interface module services at least one line side media while a second embodiment of the high-speed bit stream interface module services a back plane interface or a box interface.

In the first embodiment, the high-speed bit stream interface module includes a line side interface, a board side interface, at least one multiplexer, at least one demultiplexer, and a plurality of signal conditioning circuits. The line side interface services a line side media, receives a line side receive signal, and transmits a line side transmit signal. The board side interface services a plurality of transmit bit streams and a plurality of receive bit streams. The at least one multiplexer multiplexes the plurality of transmit bit streams to produce the line side transmit signal. The at least one demultiplexer demultiplexes the line side receive signal to produce the plurality of receive bit streams. Finally, each of the plurality of signal conditioning circuits services a respective bit stream of the plurality of transmit bit streams and the plurality of receive bit streams.

The high-speed bit stream interface module may be removably mountable on a Printed Circuit Board (PCB). Depending upon the particular embodiment of the high-speed bit stream interface module, the media interface supports optical media or copper based media. In various embodiments described herein, the media includes a TX media upon which data is transmitted and RX media upon which data is received. In one embodiment, therefore, the high-speed bit stream interface module includes receptacles for at least one pair of fiber optic media. In another embodiment, the high-speed bit stream interface module includes receptacles for at least one pair of copper media. The high-speed bit stream interface module may be received by the PCB in a socket that supports both communication with the communication ASIC and that supports the control and powering of the high-speed bit stream interface module. Such mounting allows the high-speed bit stream interface module to be removed while the remaining components mounted on the PCB continue to function.

In the second embodiment, the high-speed serial bit stream interface module includes a back plane/box interface, a board side interface, at least one demultiplexer, at least one multiplexer, and a plurality of signal conditioning circuits. The back plane/box interface services a first plurality of transmit bit streams and a first plurality of receive bit streams. The board side interface services a second plurality of transmit bit streams and a second plurality of receive bit streams. The at least one demultiplexer demultiplexes the first plurality of receive bit streams to produce the second plurality of receive bit streams. The at least one multiplexer multiplexes the second plurality of transmit bit streams to produce the first plurality of transmit bit streams. Each of the plurality of signal conditioning circuits services a respective bit stream of the first plurality of transmit bit streams and the first plurality of receive bit streams.

Each of the signal conditioning circuits may be controlled by control circuitry also contained in the high-speed bit stream interface module. The signal conditioning circuit may include an input equalizer, a limiting amplifier, clock and data recovery circuitry, and output pre-emphasis circuitry. The input equalizer receives an input bit stream and equalizes the input bit stream to remove deterministic jitter from the input bit stream. The limiting amp receives the output of the equalizer and amplifies the bit stream to predefined amplitude. The clock and data recovery circuitry receives the output of the limiting amplifier and recovers the clock and the data from the signal. The output pre-emphasis circuitry receives the output of the clock and data recovery circuitry and pre-emphasizes the bit stream prior to its transmission.

According to the present invention, identical signal conditioning circuits may be used for each signal serviced by the high-speed bit stream interface module. In such case, the various components of the signal conditioning circuit are controllable by a coupled control circuit to cause them to perform the unique operations of each serviced path. By using identically constructed signal conditioning circuits, simply programming the signal conditioning circuits for their own unique operations, substantial design efficiencies, manufacturing efficiencies, and construction efficiencies are obtained. By being able to program the operation of the components of the signal conditioning circuit, the unique characteristics of the service signals and their corresponding signal paths are substantially/fully addressed.

The high-speed serial bit stream interface may further include a receive lane synchronizer that services the plurality of receive bit streams and a transmit lane synchronizer that services the plurality of transmit bit streams. The lane synchronizers ensure that data carried by multiple bit streams is correctly reassembled upon receipt. In one embodiment, the receive lane synchronizer operates by inserting at least one bit pattern into the plurality of receive bit streams while the transmit lane synchronizer operates by inspecting at least one bit pattern contained in the plurality of transmit bit streams and realigning the plurality of bit streams when required as determined by the inspection. The high-speed serial bit stream interface may also include a receive Forward Error Correction (FEC) block that services the plurality of receive bit streams and a transmit FEC block that services the plurality of transmit bit streams.

Other features and advantages of the present invention will become apparent from the following detailed description of the invention made with reference to the accompanying drawings.

BRIEF DESCRIPTION OF THE SEVERAL VIEWS OF THE DRAWINGS

These and other features, aspects and advantages of the present invention will be more fully understood when considered with respect to the following detailed description, appended claims and accompanying drawings wherein:

FIG. 5A is a block diagram illustrating generally the structure of a portion of structure of the communication ASIC of FIG. 1;

FIG. 5C is a transmitter electrical specification of the interface between the high-speed bit stream interface module of the present invention and a communication ASIC and also a diagram illustrating the described return loss characteristics;

FIGS. 8A and 8B illustrate a bit stream having significant jitter and significant amplitude variations and the manner in which the jitter and amplitude variations affect the ability of a receiver to extract data there from;

DETAILED DESCRIPTION OF THE INVENTION

Figure 1A:
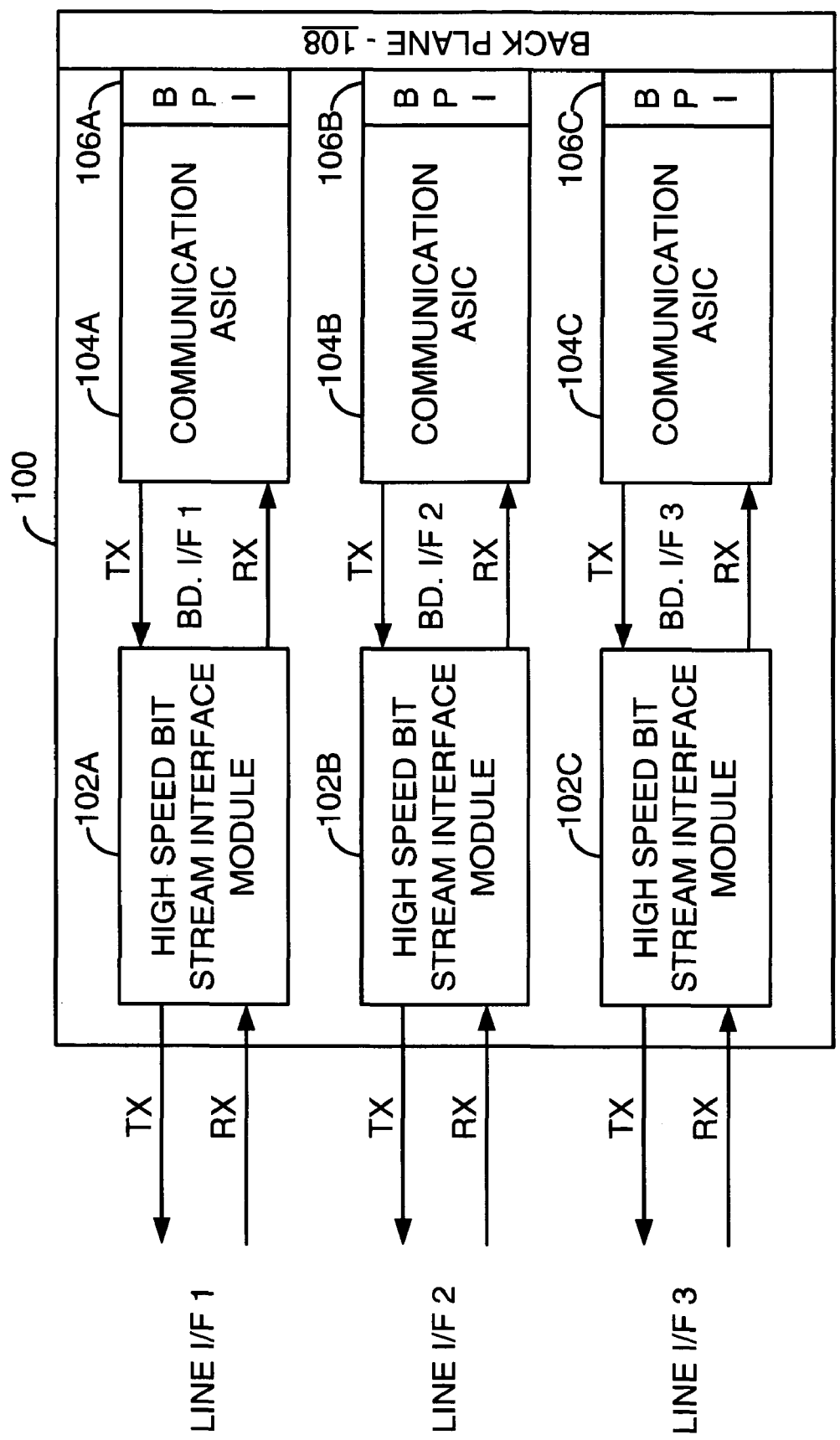
FIG. 1A is a block diagram illustrating a printed circuit board upon which high-speed bit stream interface modules constructed according to the present invention are mounted.

FIG. 1A is a block diagram illustrating a Printed Circuit Board (PCB) 100 upon which high-speed bit stream interface modules 102A, 102B, and 102C constructed according to the present invention are mounted. The PCB 100 illustrated in FIG. 1A may be installed in a housing that services all or a portion of the communication requirements of a particular switch. The PCB 100 includes three high-speed bit stream interface modules 102A, 102B, and 102C. Each of these high-speed bit stream interface modules 102A, 102B, and 102C couples both to a pair of lines on a line interface side and also couples to conductive traces via connectors on the board interface side. Each of the high-speed bit stream interface modules 102A, 102B, and 102C when mounted on the PCB 100 communicates services respective communications for Application Specific Integrated Circuits (ASICs) 104A, 104B, and 104C, respectively. During normal operations, the high-speed bit stream interface module 102A, 102B, and 102C interface to respective communication lines and to respective communication ASICs 104A, 104B, and 104C, respectively.

As will be described further with reference to FIGS. 3 and 4, the lines coupling to the high-speed bit stream interface modules 102A, 102B, and 102C may be optical, copper or another media type. When the high-speed bit stream interface modules 102A, 102B, and 102C service optical media, communications may be according to SONET, 10GIGE, 10GFC, or another operating standard. The housing and the PCBs located therein may serve as an Internet switch, an Internet hub, an Intranet switch, a telephone network hub, a data center, a Wide Area Network (WAN), or service communication system device.

With the embodiment of FIG. 1A, the high-speed bit stream interface modules 102A, 102B, and 102C support a minimum of 8" of FR4 trace on the PCB 100. The high-speed bit stream interface modules 102A, 102B, and 102C are data and protocol agnostic such that they can service a large number of differing bit stream interface standards. In such case, the high-speed bit stream interface modules 102A, 102B, and 102C support any various communication protocol and data rate. It is anticipated that the high-speed bit stream interface modules 102A, 102B, and 102C will support data rates in the 10 GBPS range. However, other data rates may also be supported.

Each of the communication ASICs 104A, 104B, and 104C communicates with other ASICs via a back plane 108 and respective back plane interfaces 106A, 106B, and 106C. The structure and operation of back plane communications is generally known and will not be described further herein except as it relates to the present invention.

The teachings of the present invention may be applied to a standardized module format. In particular, many of the teachings of the present invention have been incorporated into the XFP (10 Gigabit Form factor Pluggable Module) specification. However, the teachings of the present invention may be practiced without practicing a standardized specification to achieve the great benefits of the present invention.

Figure 1B:
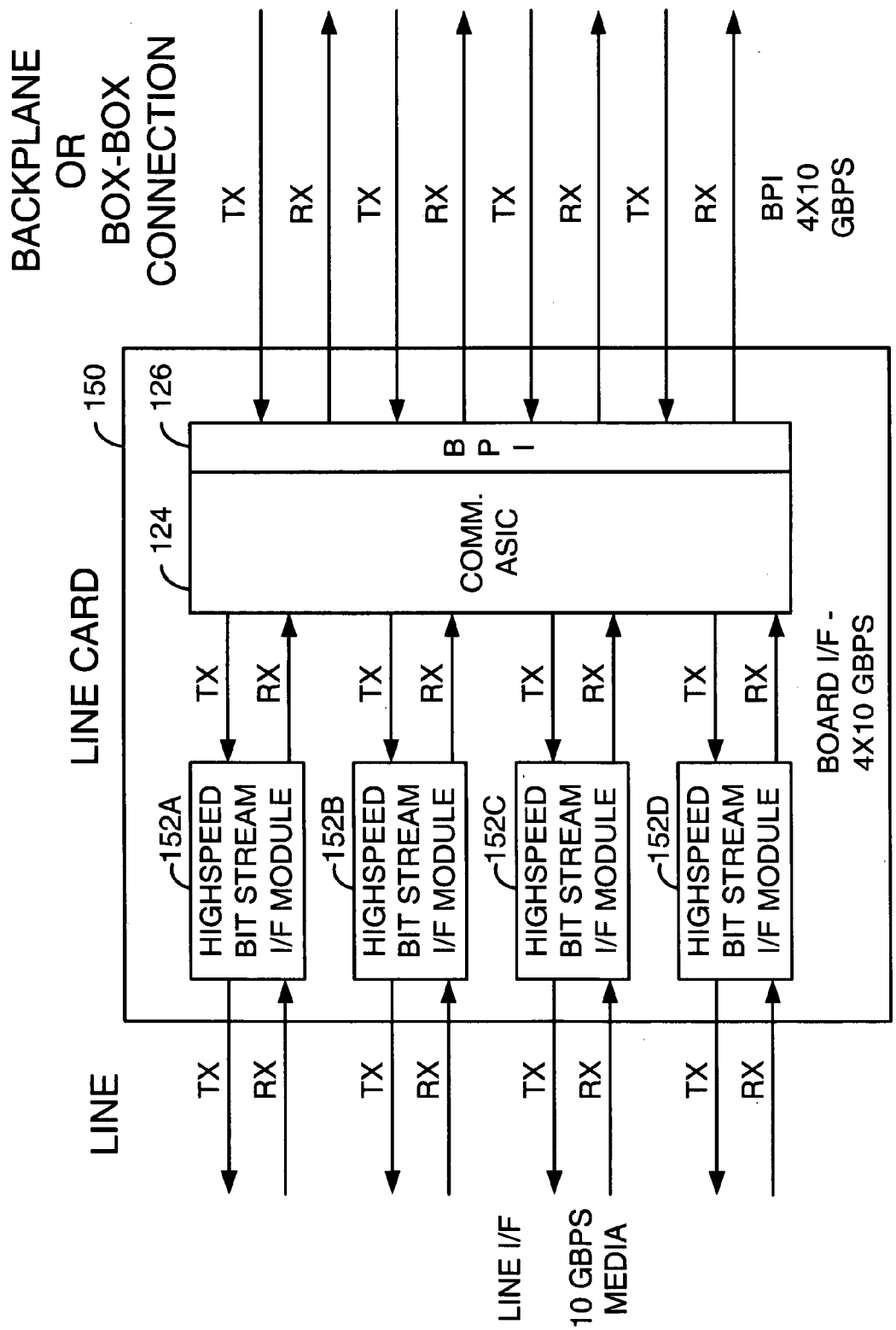
FIG. 1B is a block diagram illustrating a printed circuit board having a back plane interface that operates according to one embodiment of the present invention.

FIG. 1B is a block diagram illustrating a printed circuit board 150 having a back plane interface that operates according to one embodiment of the present invention. The printed circuit board 150 services a plurality of line side interfaces using a plurality of high-speed bit stream interface modules 152A-152D. A back plane interface module 126 services a back plane interface or a box-to-box interface. The plurality of high-speed bit stream interface modules 152A-152D and the back plane interface 126 service the communication ASIC 124.

Figure 1C:
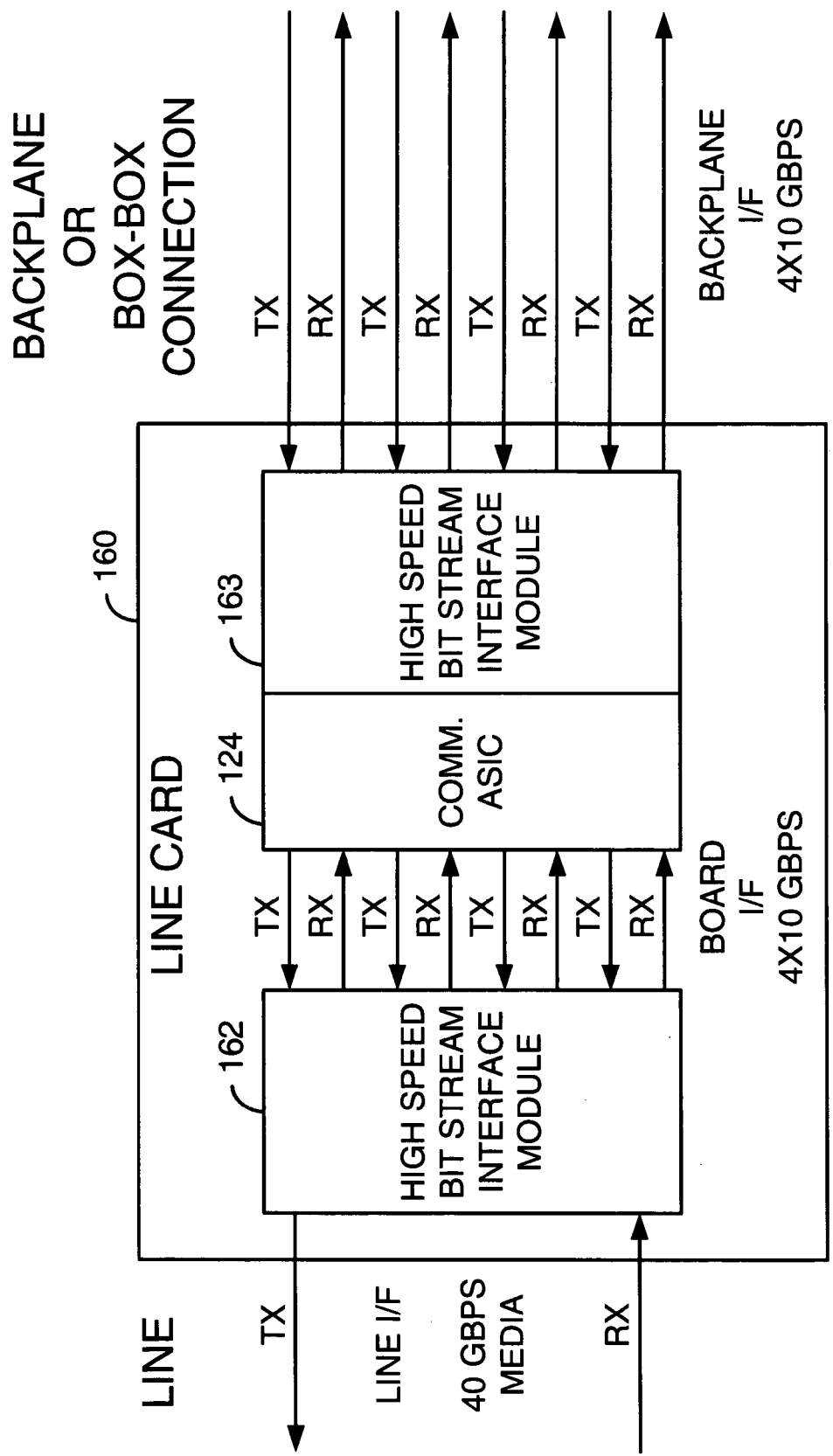
FIG. 1C is a block diagram illustrating a printed circuit board upon which two high-speed bit stream interface modules constructed according to the present invention are mounted.

FIG. 1C is a block diagram illustrating a printed circuit board 160 upon which two high-speed bit stream interface modules 162 and 163 constructed according to the present invention are mounted. The high-speed bit stream interface module 162, which will be described in detail with reference to FIG. 23, services at least one line side media and the communication ASIC. A second high-speed bit stream interface module 163, which will be described in detail with reference to FIG. 24, services a back plane interface or a box interface and the communication ASIC 124.

Figure 1D:
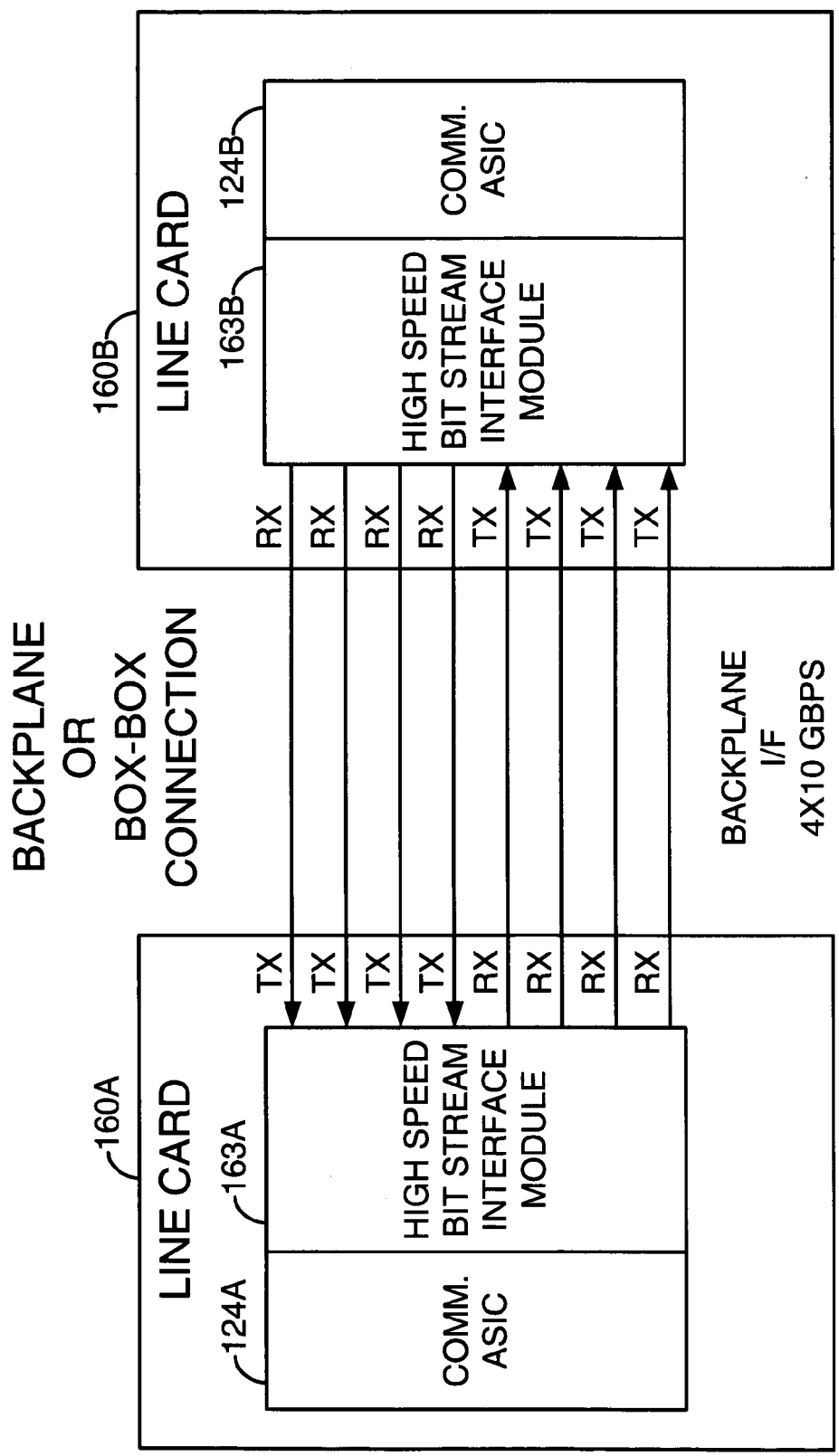
FIG. 1D is a block diagram illustrating a back plane interface/box that operates according to one embodiment of the present invention.

FIG. 1D is a block diagram illustrating a back plane interface/box that operates according to one embodiment of the present invention. Printed circuit boards 160A and 160B are coupled via a back plane interface or a box-to-box interface. Servicing the back plane interface and/or the box-to-box interface and also respective communication ASICs 124A and 124B are high-speed bit stream interface modules 163A and 163B. These high-speed bit stream interface modules 163A and 163B will be described further with reference to FIG. 24.

Figure 2A:
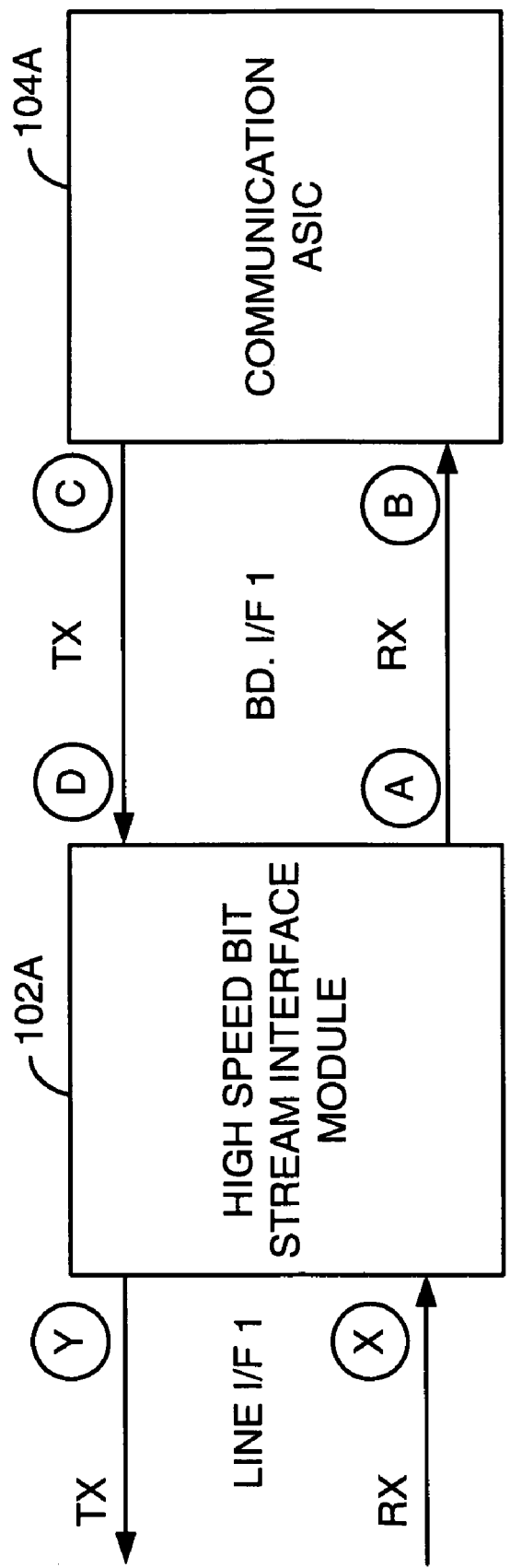
FIG. 2A is a block diagram illustrating the interconnection of a high-speed bit stream interface module constructed according to the present invention with a communication ASIC.

FIG. 2A is a block diagram illustrating the interconnection of a high-speed bit stream interface module constructed according to the present invention with a communication ASIC. As is illustrated in FIG. 2A, the high-speed bit stream interface module 102A couples on the line interface side (line side) to a TX media and an RX media. Further, on the board interface side (board side), the high-speed bit stream interface module 102A couples to receive TX data from communication ASIC 104A and couples to produce RX data to communication ASIC 104A. In the embodiments illustrated herein, the high-speed bit stream interface module 102A supports high-speed bit stream communications. The bit stream communications may be either in a non-return-to-zero (NRZ) bit stream data format or in a return-to-zero bit stream data format. These bit stream data formats are protocol agnostic and thus the high-speed bit stream interface module 102A supports various operating standards and operates upon the high-speed bit stream in a fashion that is consistent with a number of bit stream communication protocols.

The high-speed bit stream interface module 102A operates to condition signals received at points labeled as X and D. Further, the high-speed bit stream interface module operates to produce data at points A and Y. All data is received in a high-speed bit stream format and is produced in a high-speed bit stream format. From point D to point Y the high-speed bit stream interface module 102A receives a board side bit stream and conditions the bit stream to remove the deterministic jitter and to prepare the bit stream for transmission in a format that meets the line interface transmission standard at point Y. Likewise, the high-speed bit stream interface module 102A receives a line side bit stream at point X and conditions the line side bit stream prior to producing the bit stream at point A on the board side interface in a desired format. The term "bit stream" is used interchangeably herein with the term "data."

The communication ASIC 104A as is further illustrated in FIG. 5 produces data at point C and receives data at point B. The communication ASIC 104A will have requirements for the condition of the received data at point B and will have transmit specifications for the data it produces at point C. Further, from point C to point D, the PCB 100 trace will degrade the quality of the data between point C and point D. As is known, PCB traces attenuate high frequency signals due to skin effect of the traces. Further, dielectric loss of the PCB 100 will also affect the properties of data traveling along the trace. The PCB 100 also degrades/distorts the quality of the bit stream traveling from point A to point B as it does the bit stream traveling from point C to point D.

The high-speed bit stream interface module 102A must produce a signal at point A that upon receipt at point B by the communication ASIC 104A meets the received signal requirements of the communication ASIC 104A. Further, the high-speed bit stream interface module 102A must produce a signal at point Y that meets the transmission requirements of the line side interface. Moreover, the high-speed bit stream interface module 102A must receive TX data at point D and condition the signal sufficiently so that it meets the transfer requirements at point Y. Also, the high-speed bit stream interface module must receive RX data at point X and condition the signal sufficiently so that it meets the transfer requirements at point A. The manner in which the high-speed bit stream interface module 102A performs these tasks is further described herein in detail with reference to FIGS. 3-22.

Figure 2B:
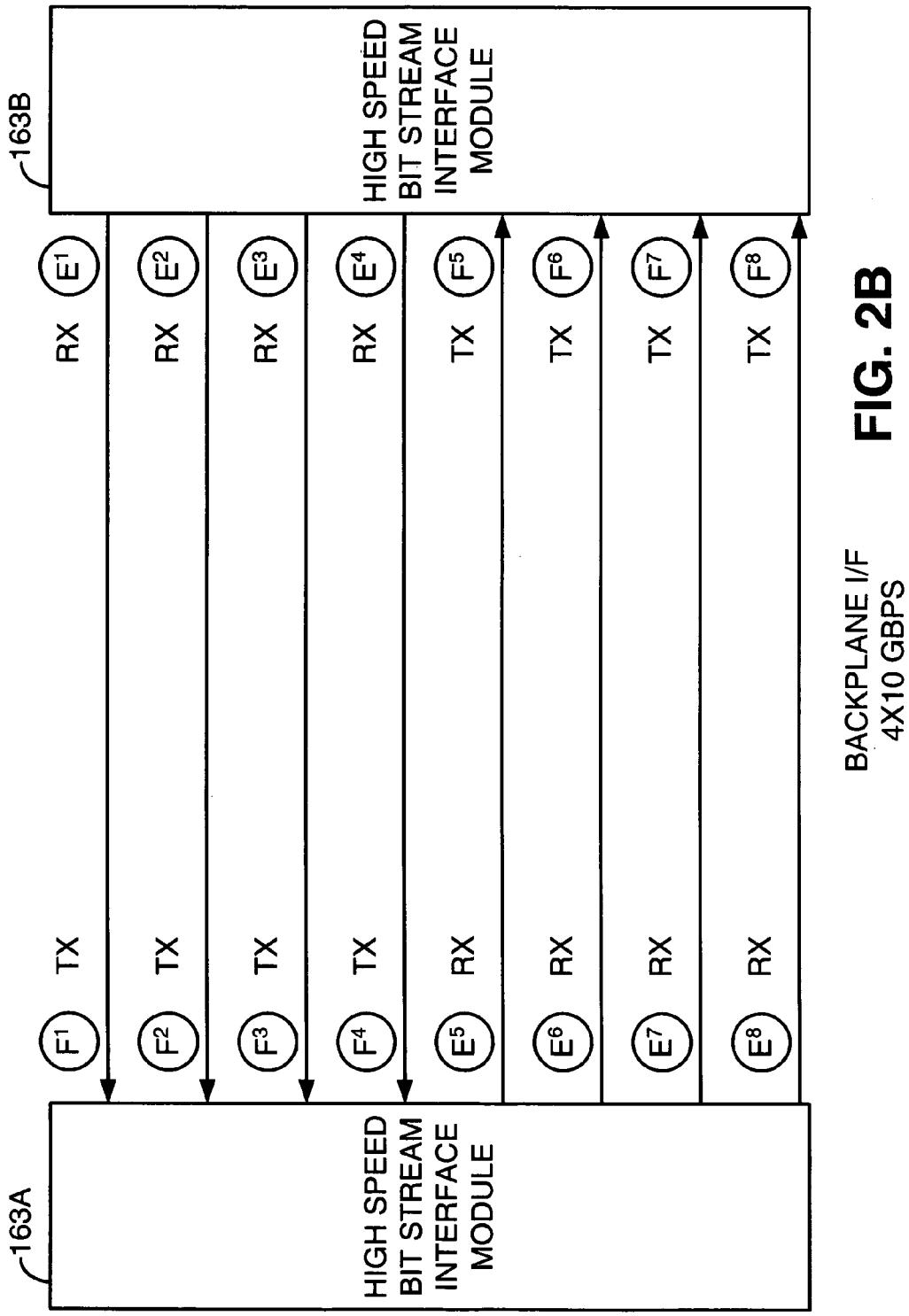
FIG. 2B is a block diagram illustrating a back plane interface/box-to-box interface serviced by high-speed bit stream interface modules constructed according to the present invention.

FIG. 2B is a block diagram illustrating a back plane interface/box-to-box interface serviced by high-speed bit stream interface modules constructed according to the present invention. The high-speed bit stream interface modules 163A and 163B services the backplane connection/box-box connection via copper conductors, fiber optic cabling, or another linkage. Signal paths between points $E''$ to $F''$, $n=1, \ldots, 8$ may each have their own unique signal propagation properties. The signal conditioning circuits within the high-speed bit stream interface modules operate to condition their serviced signals to compensate for the manner in which these signal paths affect the serviced signals. The manner in which the signal paths affect the serviced signals may differ from signal path to signal path in a particular application and/or in differing applications.

Figure 3:
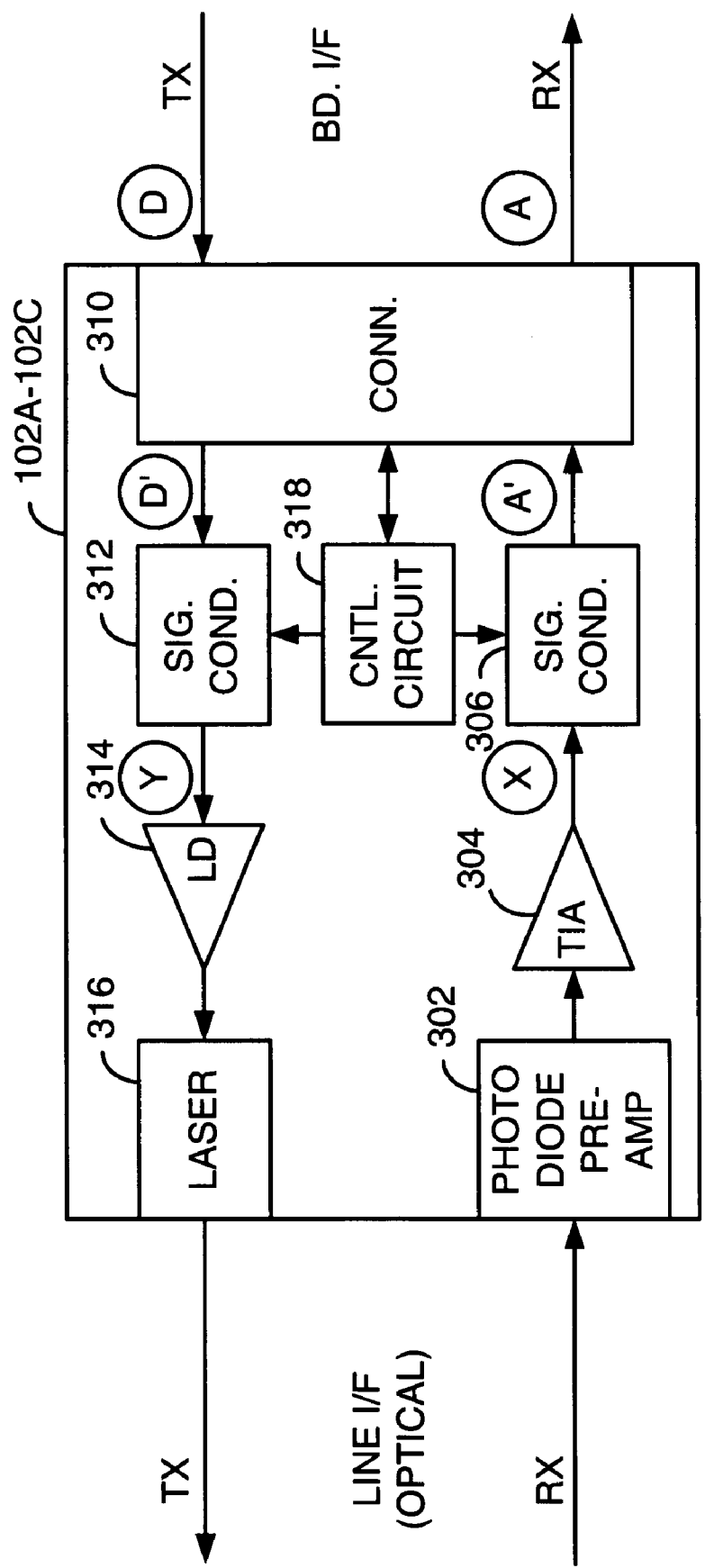
FIG. 3 is a block diagram illustrating a first embodiment of a high-speed bit stream interface module of the present invention that services optical fiber media.

FIG. 3 is a block diagram illustrating a first embodiment of a high-speed bit stream interface module of the present invention that services optical fiber media. As shown in FIG. 3, when the high-speed bit stream interface module 102A, 102B, or 102C services an optical fiber media, the high-speed bit stream interface module 102A includes components required for servicing to the optical fiber. In particular, in the RX path the optical fiber couples to the high-speed bit stream interface module 102A at a photo diode receptacle 302 that includes a pre-amplification circuit. The photo diode and pre-amplification circuit 302 receives an optical signal from the RX path fiber media and converts the optical signal to an electrical signal. The output of the photo diode pre-amplification circuit 302 is provided to trans-impedance amplifier 304, which amplifies the signal. The output of the trans-impedance amplifier 304 is received by signal conditioning circuit 306. The signal conditioning circuit 306 receives the signal at point X and conditions the circuit to produce an output at point A'. The output signal at point A' is then coupled via connector 310 to point A on the board side of the high-speed bit stream interface module 102A (or 102B or 102C).

In the TX path, the high-speed bit stream interface module 102A receives TX data from the communication ASIC at point D on the board side. Connector 310 couples the transmit signal to the signal conditioning circuits at point D'. The signal conditioning circuit 312 receives the signal at point D', conditions the signal, and produces a conditioned signal to laser diode amplifier 314 at point Y. The laser diode amplifier 314 amplifies the signal received from signal conditioning circuit 312 at point Y and provides the electrical signal to laser 316. Laser 316 couples to transmit optical media and produces the transmit signal at that location.

Figure 4:
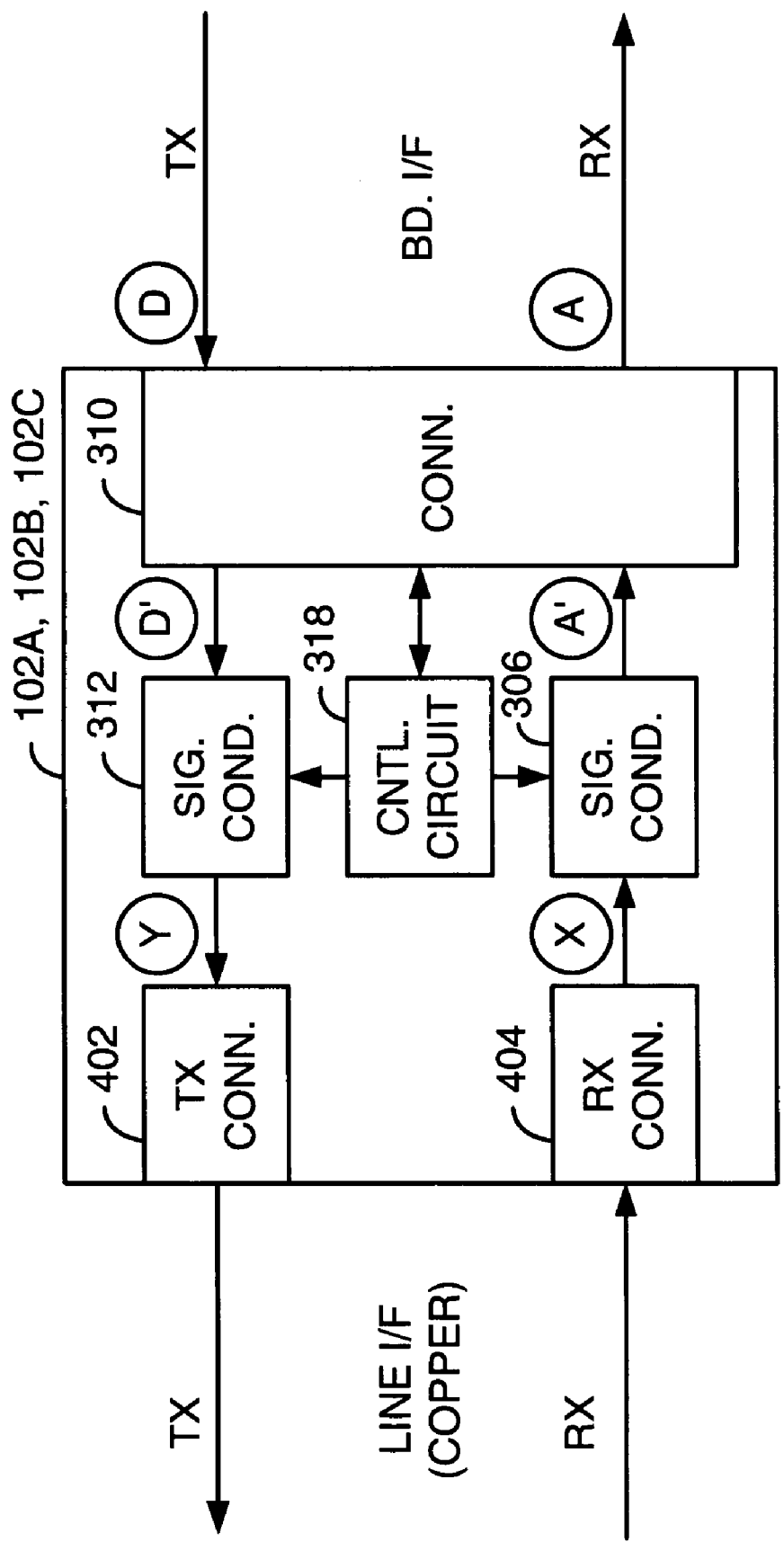
FIG. 4 is a block diagram illustrating a second embodiment of a high-speed bit stream interface module of the present invention that services copper media.

FIG. 4 is a block diagram illustrating a second embodiment of a high-speed bit stream interface module of the present invention that services copper media. As shown in FIG. 4, the embodiment of the high-speed bit stream interface module that services a copper media does not include those components respective to the optical media. However, the high-speed bit stream interface module 102A, 102B, or 102C includes the connector 310, signal-conditioning circuit 312, signal conditioning circuit 306, and the control circuitry 318. However in the embodiment of FIG. 4, in the TX path the output signal conditioning circuit 312 couples the TX data directly to TX media connector 402 that couples the TX data to TX copper media. Likewise, in the RX path an RX media connector 404 couples to RX copper media to receive the RX data and to couple the RX data to signal conditioning circuit 306.

As will be described further, the signal conditioning circuits 306 and 312 have an identical structure but are controllable to meet the specific requirements of their respective signal paths. The flexibility provided by the programmability of these circuits is significant. Because of this flexibility, the high-speed bit stream interface module 102A, 102B, or 102C may be installed in any PCB and be employed to service any of a large number of bit stream interface standards. By programming the operation of the signal conditioning circuits 306 and 312, the high-speed bit stream interface module 102A, 102B, or 102C is able to compensate for the unique construction of the PCB which it services, the requirements of the coupled ASIC, and also the requirements of the serviced media/protocol.

FIG. 5A is a block diagram illustrating generally a portion of the structure of the communication ASIC (104A, 104B, or 104C) of FIG. 1. As shown in FIG. 5A, the communication ASIC 104A (104B or 104C) includes a signal processing integrated circuit 502, a multiplexer 504, and a demultiplexer 506. On the RX side the demultiplexer 506 receives the RX data at point B and demultiplexes the data to provide the de-multiplexed data to the signal processing integrated circuit 502. On the transmit side, the signal processing integrated circuit 502 produces TX data to the multiplexer 504 which multiplexes the data to produce the transmit data at point C. As was previously described, the multiplexer 504 produces data at point C according to transmit specifications for the communication ASIC 104A-104C. Likewise, the demultiplexer 506 is required to recover a signal at point B that meets its receive signal characteristics.

As was previously illustrated with respect to FIG. 1, communication ASIC couples to the back plane 108 via a back plane interface. Thus, the signal processing integrated circuit includes an interface to the back plane interface. Of course, the communication ASIC 104A (104B or 104C) will typically include components in addition to those illustrated in FIG. 5A.

Figure 5B:
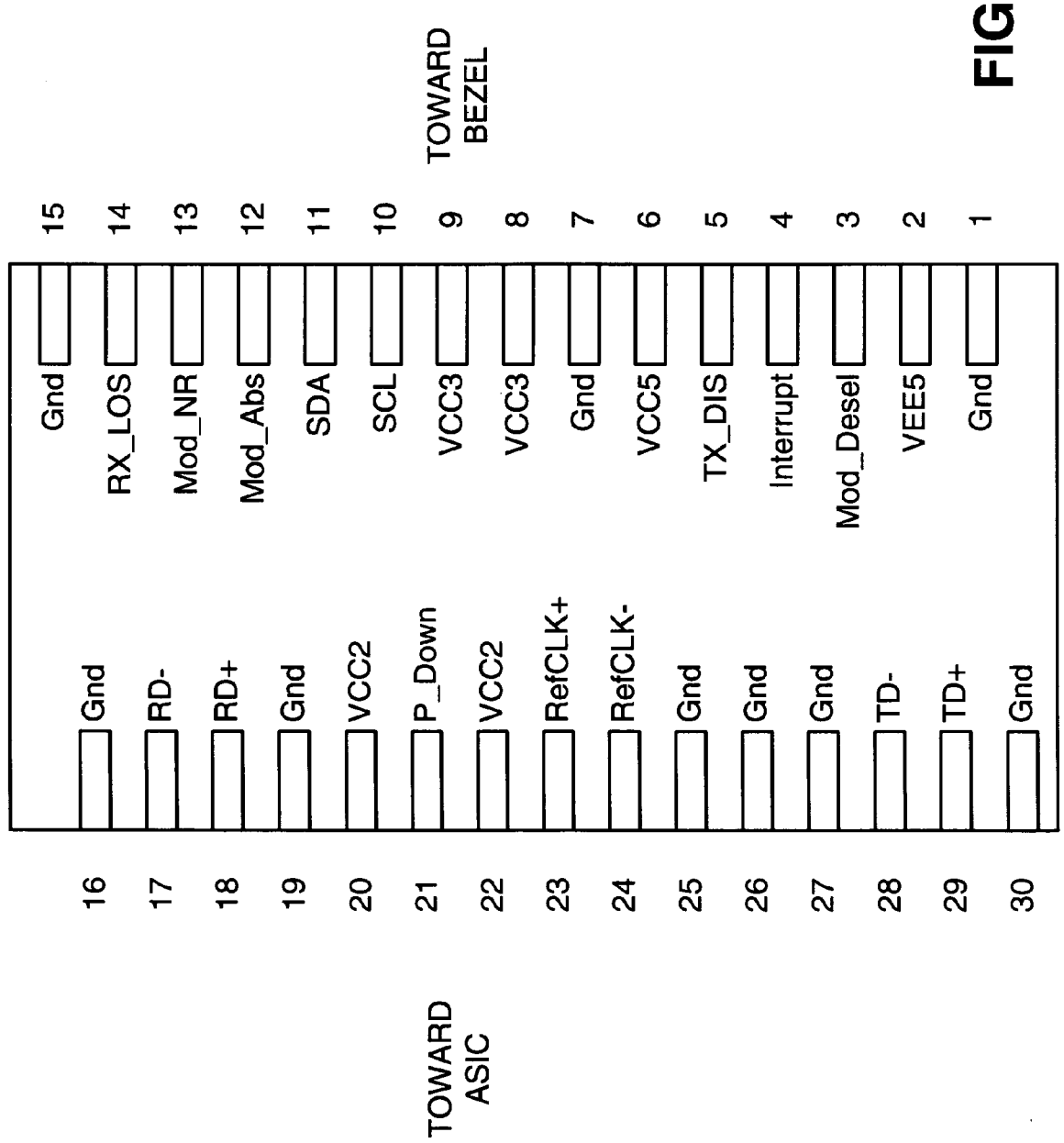
FIG. 5B is a block diagram illustrating a pin out of the interface between the high-speed bit stream interface module of the present invention and a communication ASIC.

FIG. 5B is a block diagram illustrating a pin out of the interface between the high-speed bit stream interface module of the present invention and a communication ASIC. In addition to the two wire serial interface the module has a number of low speed hard wired pins for control and status of the high-speed bit stream interface module. The interface between the high-speed bit stream interface module and the communication ASIC includes differential RX data signal lines RD+ and RD−. The interface further includes differential TX data signal lines TX+ and TX−. Further, the interface includes differential clock lines RefCLK+ and RefCLK−. The interface further includes various status lines, power lines, ground lines, and other lines as indicated in Table 1—below.

TABLE 1

Module Interface to Communication ASIC

| Pin | Logic | Symbol | Name/Description |
|---|---|---|---|
| 1 | | Gnd | Module Ground |
| 2 | | VEE5 | Optional −5.2 V Power Supply |
| 3 | LVTTL-I | Mod_Desel | Module De-select; When held low allows the module to respond to 2-wire serial interface commands |
| 4 | LVTTL-O | Interrupt | Interrupt; Indicates presence of an important condition which can be read over the serial 2-wire interface |
| 5 | LVTTL-I | TX_DIS | Transmitter Disable; Transmitter Laser Source Turned Off |
| 6 | | VCC5 | +5 V Power Supply |
| 7 | | Gnd | Module Ground |
| 8 | | VCC3 | +3.3 V Power Supply |
| 9 | | VCC3 | +3.3 V Power Supply |
| 10 | LVTTL-I | SCA | Two Wire Interface Clock |
| 11 | LVTTL-I/O | SDA | Two Wire Interface Data Line |
| 12 | LVTTL-O | Mod_Abs | Indicates Module is not present. Grounded in the Module |
| 13 | LVTTL-O | Mod_NR | Module Not Ready; Indicating Module Operational Fault |
| 14 | LVTTL-O | RX_LOS | Receiver Loss of Signal Indicator |
| 15 | | Gnd | Module Ground |
| 16 | | Gnd | Module Ground |
| 17 | CML-O | RD− | Receiver Inverted Data Output |
| 18 | CML-O | RD+ | Receiver Non-Inverted Data Output |
| 19 | | Gnd | Module Ground |
| 20 | | VCC2 | +1.8 V Power Supply |
| 21 | LVTTL-I | P_Down | Power down; When high, places the |

TABLE 1-continued

Module Interface to Communication ASIC

| Pin | Logic | Symbol | Name/Description |
|---|---|---|---|
| | | | module in the low power standby mode and on the falling edge of P_Down initiates a module reset. |
| 22 | | VCC2 | +1.8 V Power Supply |
| 23 | | Gnd | Module Ground |
| 24 | PECL-I | RefCLK+ | Reference Clock Non-Inverted Input, AC coupled on the host board |
| 25 | PECL-I | RefCLK− | Reference Clock Inverted Input, AC coupled on the host board |
| 26 | | Gnd | Module Ground |
| 27 | | Gnd | Module Ground |
| 28 | CML-I | TD− | Transmitter Inverted Data Input |
| 29 | CML-I | TD+ | Transmitter Non-Inverted Data Input |
| 30 | | Gnd | Module Ground |

The Mod_NR is an output pin when High, indicates any condition which transmitter or receiver data is not valid. The Mod_NR output pin is an open collector and must be pulled to VCC3 on the host board. A module not implementing Mod_NR shall hold the signal low in the module. The Mod_DeSel is an input pin when held Low by the host, the module respond to 2-wire serial communication commands. The Mod_DeSel allow the use of multiple modules on a single 2-wire interface bus. When the Mod_DeSel pin is high, the module shall not respond to or acknowledge any 2-wire interface communication from the host. Mod_DeSel pin is an open collector and must be pulled to VCC3 in the module. A module not implementing Mod_DeSel shall hold the signal low in the module. Interrupt is an output pin when High indicates possible module operational fault or a status change critical to the host system. The Interrupt pin is an open collector output and must be pulled to VCC3 on the host board. Modules not implementing Interrupt shall hold the pin low in the module.

When TX_DIS is asserted, "High" turns off the module transmitter output. The TX_DIS pin and must be pulled up to VCC3 on the module board. Mod_ABS is pulled up to VCC3 on the host board and grounded in the module. Mod_ABS is then asserted "High" when the module is physically absent from a host slot. The RX_LOS when held High indicates insufficient optical power for reliable signal reception. The RX_LOS pin is an open collector and must be pulled up to VCC3 on the host board. The P_Down pin, when held High by the host, places the module in the standby mode with a maximum power dissipation of 1.5W. On the negative edge of the P_Down transition a module is reset. The P_Down pin must be pulled up to VCC3 in the module.

FIG. 5C is a transmitter electrical specification of the interface between the high-speed bit stream interface module of the present invention and a communication ASIC. As is shown in FIG. 5C, the transmitter specifications for the interface between the high-speed bit stream interface module 102A and the communication ASIC 104A are set forth. The PCB 100 upon which the high-speed bit stream interface module 102A and the communication ASIC 104A are mounted is preferably constructed of an FR4 material. However, in some embodiments, the FR4 material is enhanced to provide better performance. The transmitter electrical specification has typically 50 Ohm single-ended output impedance and a 100-Ohm differential output impedance. Output impedance matching is required to be within 10%. The common mode logic output amplitude of the differential output is max 600 microvolts and typically 500 microvolts. Further, the output rise and fall time from 20% to 80% is typically 28 picoseconds with a minimum of 24 picoseconds and a max of 40 picoseconds. The differential output return loss up is maximum −10 dB up to a frequency of 7.5 gigahertz. The single-ended output return loss is maximum −5 dB up to a frequency of 15 gigahertz. The diagram of FIG. 5C is a graph illustrating return loss of the transmitter interface as a function of frequency.

Figure 5D:
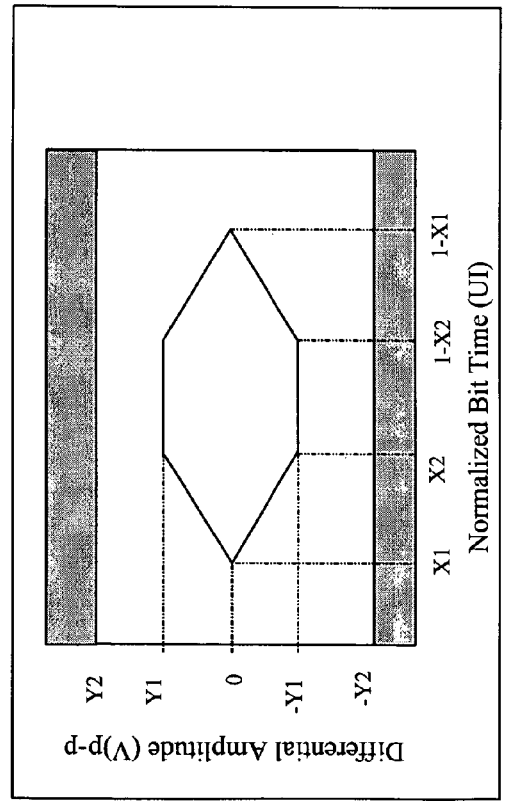
FIG. 5D is a transmitter jitter specification of the interface between the high-speed bit stream interface module of the present invention and a communication ASIC and also a diagram illustrating how the components of the jitter specification are defined.

FIG. 5D is a transmitter jitter specification of the interface between the high-speed bit stream interface module of the present invention and a communication ASIC and also a diagram illustrating how the components of the jitter specification are defined. In particular, FIG. 5D addresses the jitter specification for the high-speed bit stream interface module transmitter operations on its board side. As illustrated in FIG. 5D, the transmitter has a nominal bit rate between 9.95 gigahertz and 10.75 gigahertz. The deterministic jitter produced by the transmitter has typically 0.12 UI units of maximum 0.15 UI units. The random jitter produced by the transmitter has typically 0.13 UI units and maximum 0.15 UI units. The eye mask for the transmitter is shown in the graph of FIG. 5D and the manner in which the eye mask relates to the specification of the table of FIG. 5D. The SONET jitter (RMS) for the board side interface at up to 80 megahertz is a maximum of 10 milli-units.

Figure 5E:
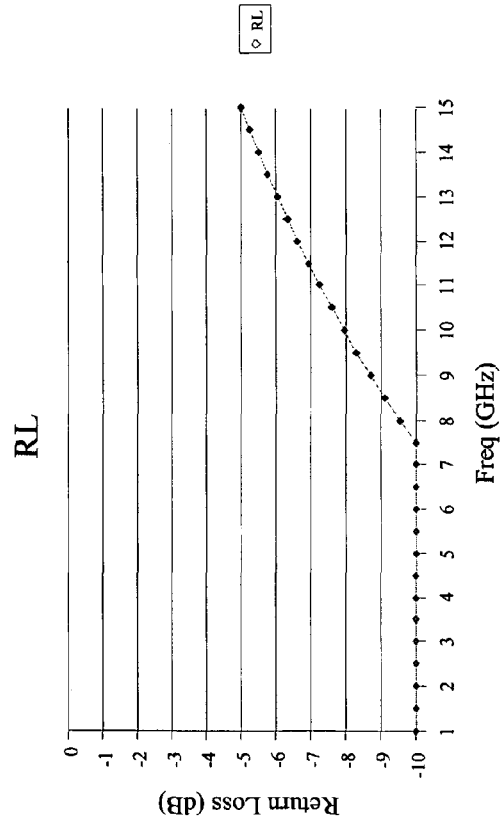
FIG. 5E is a receiver electrical specification of the interface between the high-speed bit stream interface module of the present invention and a communication ASIC and also a diagram illustrating the described return loss characteristics.

FIG. 5E is a receiver electrical specification of the interface between the high-speed bit stream interface module of the present invention and a communication ASIC and also a diagram illustrating the described return loss characteristics (as a function of frequency). As was the case for the transmitter specs, the single-ended input impedance is 50 Ohms typical and the differential input impedance is 100 Ohms typical. Further, the input impedance match is 10%, the common mode logic input differential amplitude peak-to-peak is minimum 125 mV and the maximum 1000 mV. The differential input return loss as is plotted in the graph of FIG. 5E is −10 dB up to 7.5 gigahertz. Further, the single-ended input return loss is −5 dB up to 15 gigahertz.

Figure 5F:
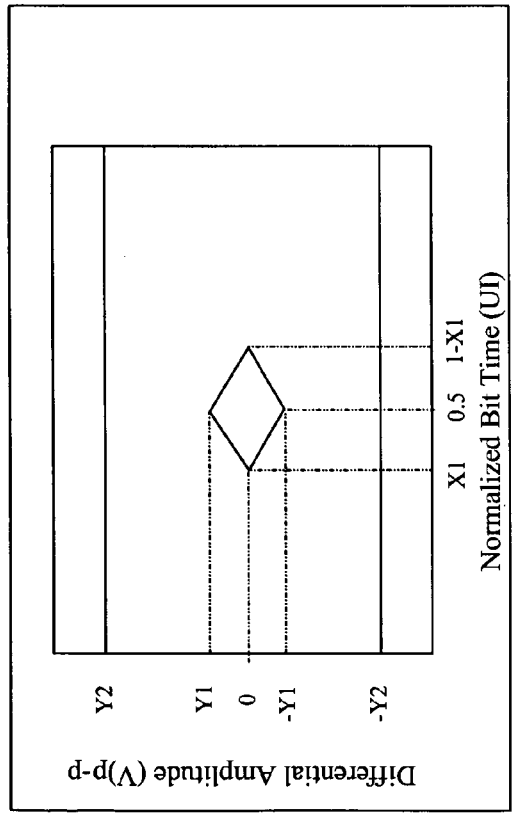
FIG. 5F is a receiver jitter specification of the interface between the high-speed bit stream interface module of the present invention and a communication ASIC and also a diagram illustrating how the components of the jitter specification are defined.

FIG. 5F is a receiver jitter specification of the interface between the high-speed bit stream interface module of the present invention and a communication ASIC and also a diagram illustrating how the components of the jitter specification are defined. The table and graph of FIG. 5F defines the receiver interface of the high-speed bit stream interface module 102A with regard to the receipt of the bit stream from communication ASIC 104A across the traces of the PCB 100.

As was the case of the transmitter of the module, the nominal bit rate has a minimum of 9.95 gigahertz and a maximum of 10.75 gigahertz. The deterministic jitter of the receiver is 0.35 UIs typically and 0.55 UIs max. The random jitter supported by the receiver is typically 0.18 UI and maximum 0.2 UI. The eye mask as is further defined in the graph of FIG. 5F shows the tolerance of the receiver to jitter in the received bit stream from the communication ASIC 104A. Further, the SONET jitter up to 80 megahertz is 30 micro units.

Figure 5G:
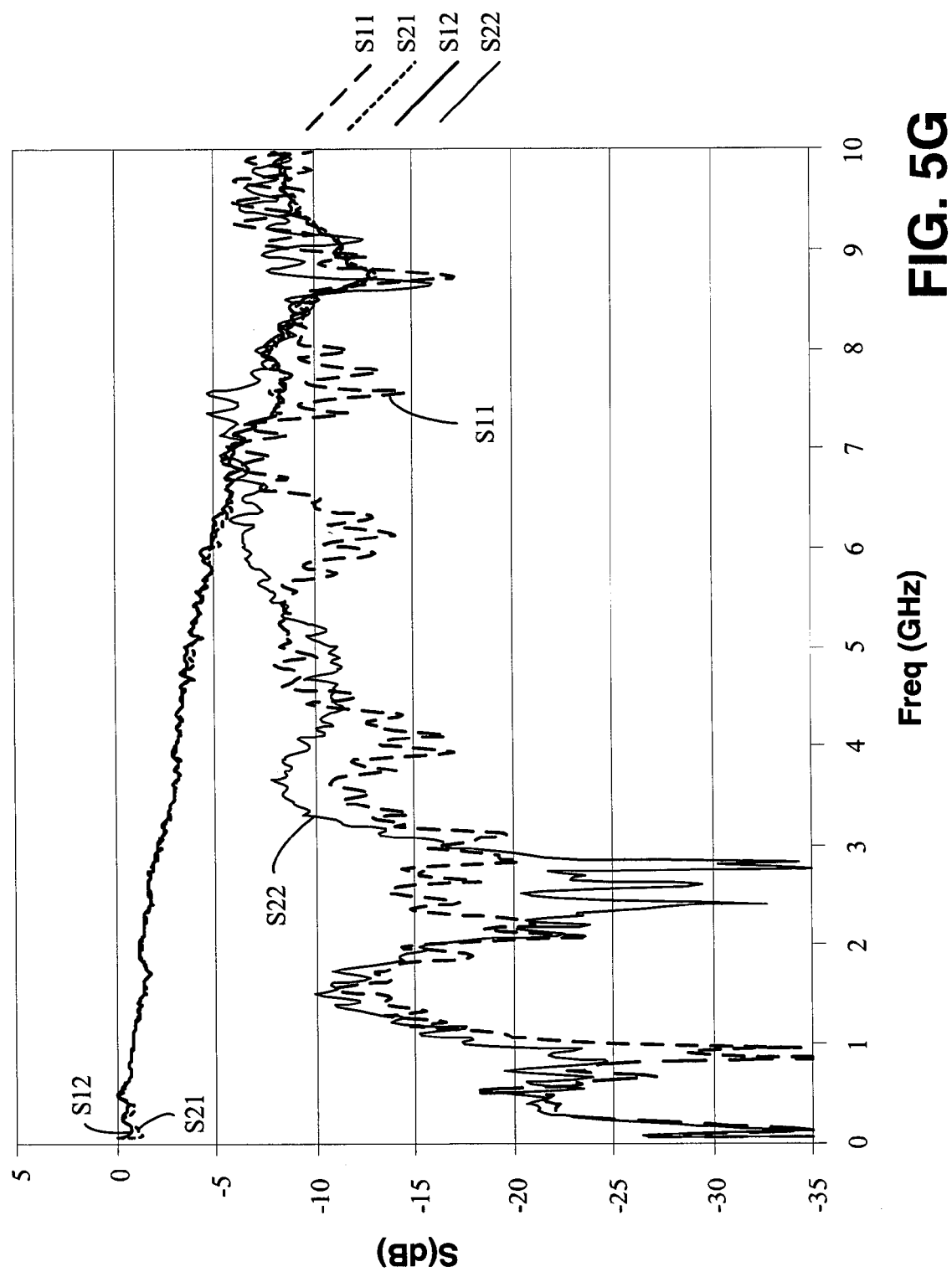
FIG. 5G is a graph illustrating the frequency response of a connector of the high-speed bit stream interface module in combination with a 4" FR4 trace of the PCB coupling the connector to the communication ASIC.

FIG. 5G is a graph illustrating the frequency response of a connector of the high-speed bit stream interface module in combination with a 4" FR4 trace of the PCB 100 coupling the connector to the communication ASIC. The frequency response as illustrated exhibits attenuation that increases with frequency. This behavior is addressed by the signal conditioning circuit 312 and 306 of the high-speed bit stream interface module 102A. Such signal conditioning is both performed on received signals to open the eye of the receive signals and is also employed on the transmit side of the high-speed bit stream interface module 102A to precondition output signals that are transmitted across the PCB 100 to the communication ASIC 104A. The manner in which signals may be degraded upon receipt is described further with reference to FIGS. 6-9. The signal conditioning circuit that operates upon such RX signals and that operates upon the RX signals to produce compliant TX signals is described further with reference to FIGS. 10-22.

Jitter is a term that describes the variation in phase of bits of a bit stream signal. Jitter can be divided into main categories: deterministic jitter and non-deterministic jitter. Non-deterministic Jitter (or random jitter, RJ) arises from noise or other transmission related phenomena that can be described only on a statistical basis. In this category fall Gaussian noise related jitter and 1/f noise related jitter, among others. Random jitter cannot be compensated for in any way. The communication ASIC and the TX media have a certain maximum amount of non-deterministic jitter that they can tolerate. Deterministic jitter (DJ), on the other hand, is predictable in nature and some forms of deterministic jitter are such that once the phenomenon that generates this jitter is known it can be compensated. An example of DJ is ISI (inter symbol interference) related jitter. If the bandwidth of a transmission media, e.g., PCB 100 trace, is below the Nyquist rate, ISI will arise and create a certain amount of DJ in the bit stream carried by the PCB 100 trace.

Two phenomena contribute to limit the bandwidth of board traces and cables. The first is skin effect and the second is dielectric loss. Skin effect dominates the high frequency attenuation in cables. Dielectric loss is the main cause of bandwidth limitation for board traces. Each of these phenomena alone, or in combination, attenuate high frequency components of the bit stream and introduce group delay variations that cause ISI which degrades the received bit stream adding DJ to the RJ.

The envelope of the power spectrum of a Pseudo Random Bit Stream (PRBS) signal is described as:

$$PRBS(\omega) \cong \frac{\left[\text{Sin}\left(\frac{\pi f}{Bitrate}\right)\right]^2}{\left[\frac{\pi f}{Bitrate}\right]^2} \quad \text{Equation (1)}$$

When the PRBS signal is sent through a band limited transmission line, such as a trace formed on the PCB 100, the PRBS spectrum is altered resulting into ISI. As will be described further with reference to FIGS. 10-22, the high-speed bit stream interface module 102A, 102B, or 102C of the present invention operates in an attempt to fully restore the power spectrum of the PRBS signal therefore eliminating most, if not all of the ISI. The equalized PRBS signal may then be recovered so that even a large ISI residual will be removed and a maximum jitter tolerance may be met.

Figure 6A:
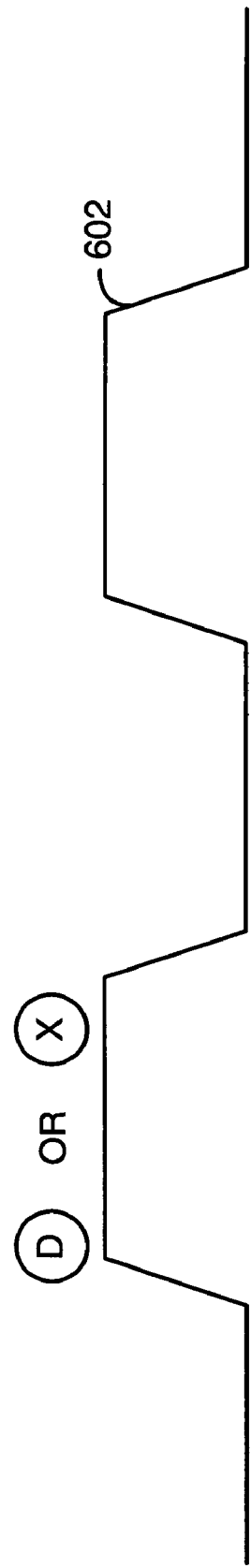
FIGS. 6A and 6B are diagrams illustrating a bit stream that has no little or no jitter.
Figure 6B:
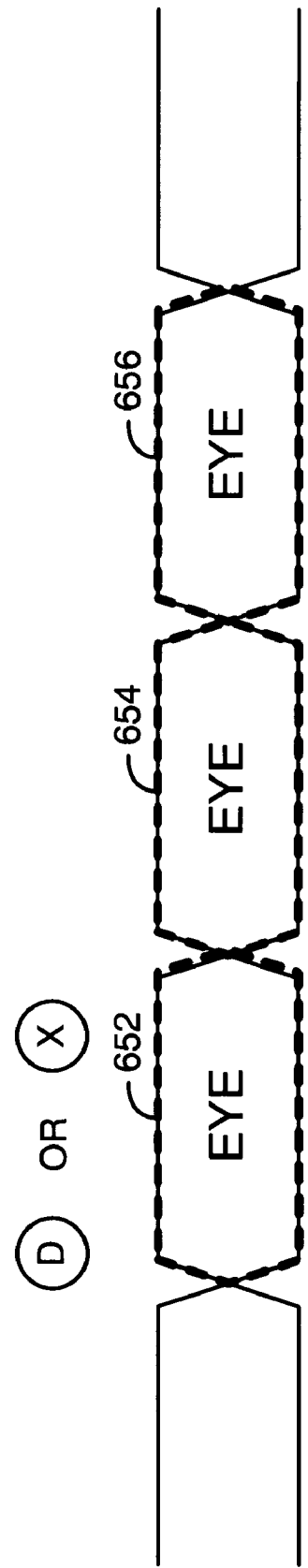

FIGS. 6A through 9B illustrate received bit streams with differing levels of jitter/ISI. FIGS. 6A and 6B are diagrams illustrating a bit stream that has little or no jitter. A bit stream 602 is received at point D or point X by the high-speed bit stream interface module 102A. The bit stream 602 includes both a positive and a negative component since it is received as a differential signal. FIG. 6A illustrates the positive component of the bit stream 602, which is a clean bit stream with no jitter. FIG. 6B illustrates the superimposition of the positive and negative components of the differential bit stream. When the positive and negative components are brought together, eyes are formed, each of which corresponds to a bit of data carried by the bit stream. Eyes 652, 654 and 656 correspond to bits carried during respective bit times. As illustrated, eyes 652, 654 and 656 are evenly distributed and have a substantially equal duration and magnitude. Such is the case because the bit stream 602 has little or no jitter. With such an even distribution, the extraction of data from bit stream 602 is relatively easy.

Figure 7A:
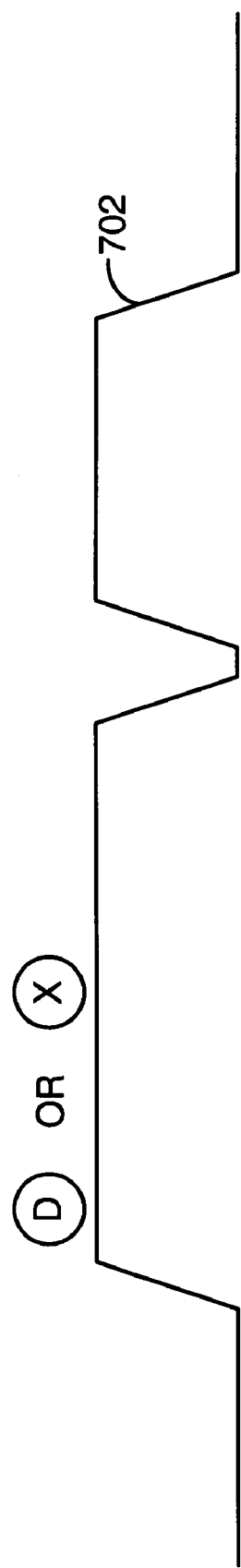
FIGS. 7A and 7B illustrate a bit stream having some jitter and the manner in which jitter effects the eyes of the data.
Figure 7B:
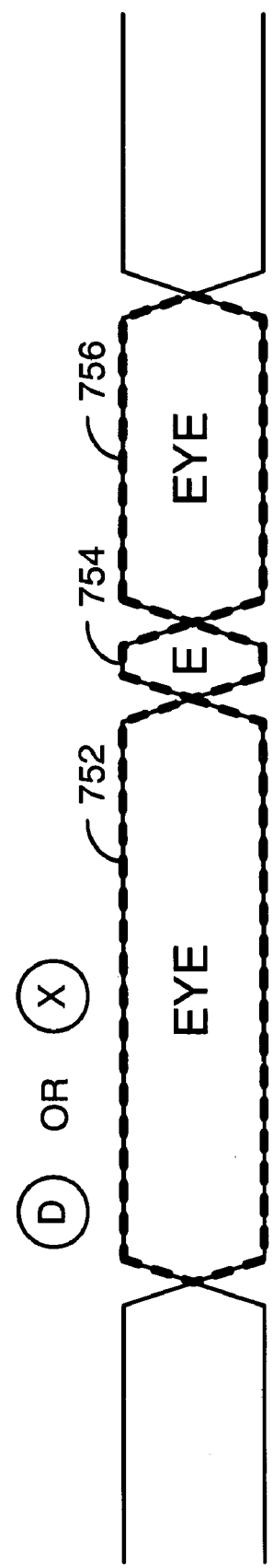

FIGS. 7A and 7B illustrate a bit stream having some jitter and amplitude variations and the manner in which the jitter and amplitude variations affect the ability of a receiver to extract data there from. The bit stream 702 of FIG. 7A as compared to the bit stream 602 of FIG. 6A has substantial jitter and some amplitude variation. The bit stream 702 is an NRZ bit stream. Thus, the amplitude will typically vary with time. As shown in FIG. 7B, the positive and negative components of the bit stream 702 are combined to produce eyes 752, 754, and 756 corresponding to respective bit times. Because of the jitter and amplitude variation in the bit stream 702, eyes 752, 754, and 756 have differing durations and/or heights. Extraction of data from the bit stream 702 may therefore be difficult, certainly more difficult than that required for extracting data from the bit stream of FIGS. 6A and 6B.

Figure 8A:
Figure 8B:
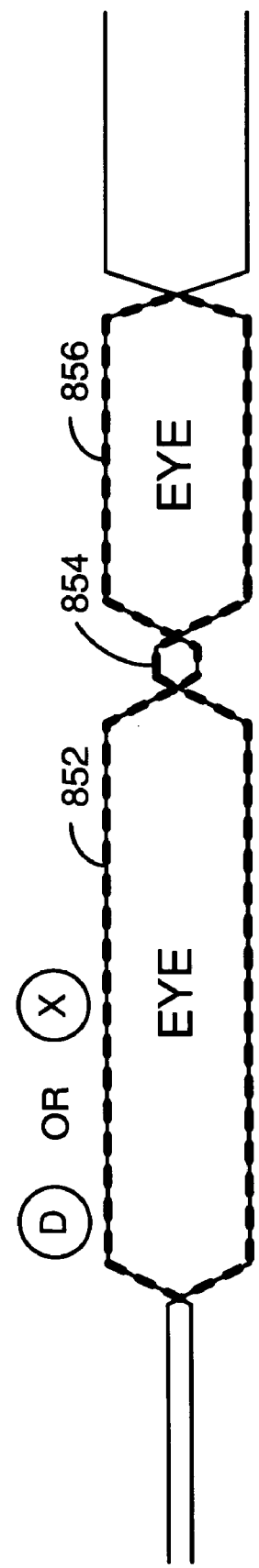

FIGS. 8A and 8B illustrate a bit stream having significant jitter and significant amplitude variations and the manner in which the jitter and amplitude variations affect the ability of a receiver to extract data there from. As shown in FIG. 8A, the bit stream 802 has significant jitter and also has variations in its magnitude. When this bit stream is operated upon to create eyes 852, 854, and 856, the eyes are of different duration and are of differing magnitude. In particular, eye 854 is very small in amplitude and short in duration. Thus, extraction of data from the bit stream 802 will be difficult.

Figure 9A:
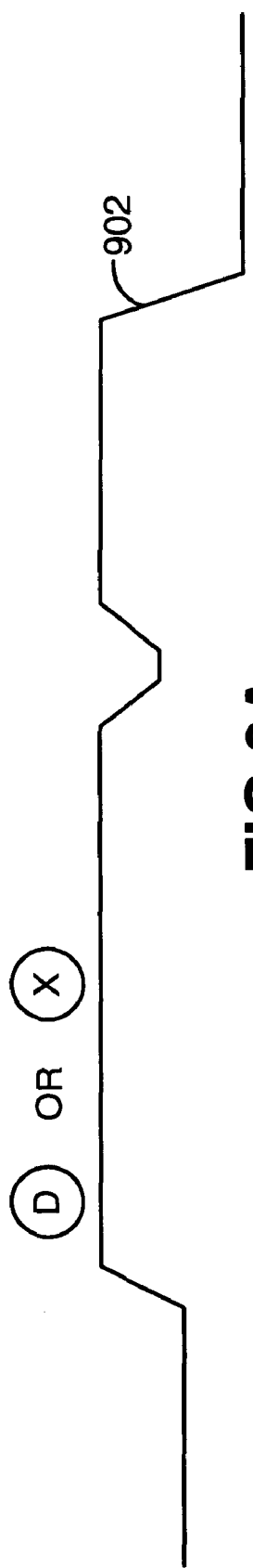
FIGS. 9A and 9B illustrate a bit stream having significant jitter and significant amplitude variations and the manner in which the jitter and amplitude variations preclude a receiver from extracting all carried data from the bit stream.
Figure 9B:
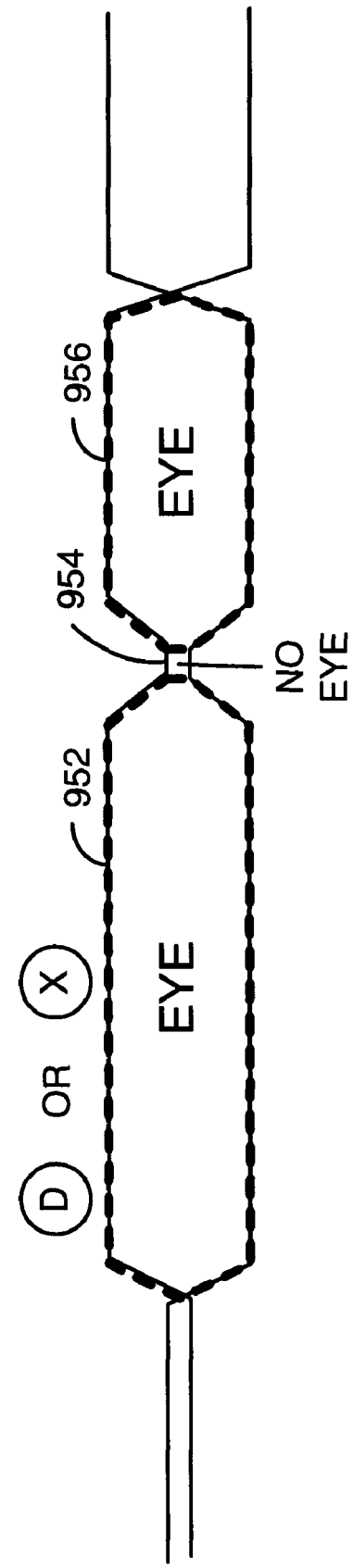

FIGS. 9A and 9B illustrate a bit stream 902 having significant jitter and significant amplitude variations and the manner in which the jitter and amplitude variations preclude a receiver from extracting all carried data from the bit stream 902. As is shown, bit stream 902 includes significant jitter and variations in its magnitude. When the bit stream is operated upon in an attempt to produce eyes in the data, as shown in FIG. 9B, the jitter and magnitude variations are significant enough such that no eye is produced at 954. Thus, this bit stream 902 is of such poor quality that a data bit at position 954 is non-recoverable. The high-speed bit stream interface module 102A (102B or 102C) of the present invention operates to remove deterministic jitter from the bit stream 902 so that data can be extracted from the bit stream.

Figure 10:
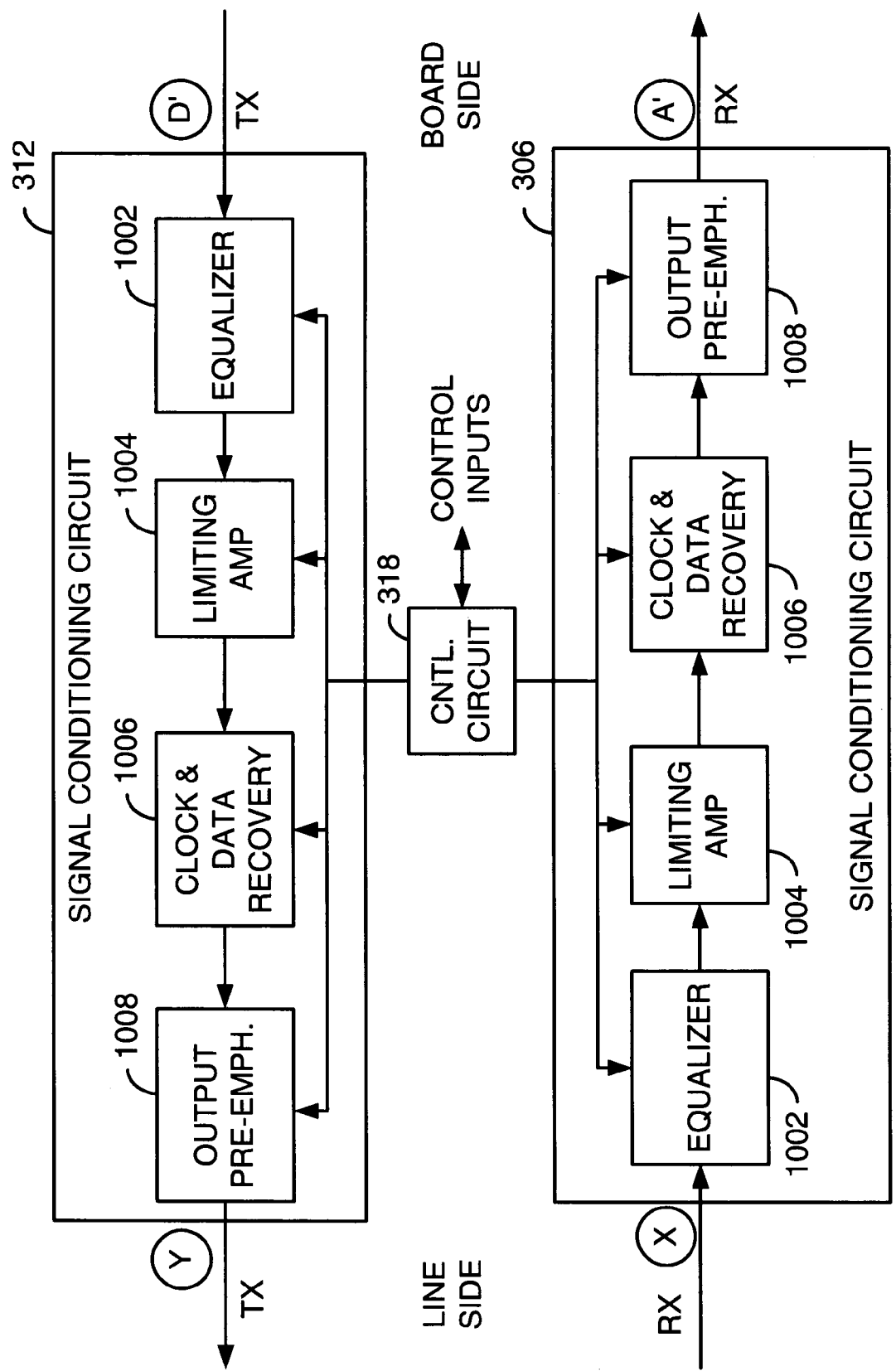
FIG. 10 is a block diagram illustrating signal conditioning circuits constructed according to the present invention that service both a TX path and a RX path for a high-speed bit stream interface module constructed according to the present invention.

FIG. 10 is a block diagram illustrating signal conditioning circuits constructed according to the present invention that service both a TX path and a RX path for a high-speed bit stream interface module constructed according to the present invention. As is shown in FIG. 10, signal conditioning circuit 312 servicing a TX path and signal conditioning circuit 306 servicing a RX path are identical circuits. In such case, each of signal conditioning circuit 312 and signal conditioning circuit 306 includes an input equalizer 1002, a limiting amplifier 1004, a clock and data recovery circuit (CDR) 1006, and an output pre-emphasis circuit 1008. Each of these circuits is controlled by a control circuit 318 that may be programmed by pin settings, a digital interface, e.g., I2C interface, or by another type of interface. Based upon these control inputs, the signal conditioning circuits 312 and 306 will perform signal conditioning commensurate with the respective signal paths they service.

As is shown, the signal conditioning circuit 312 receives the TX data at point D' on the board side of the high-speed bit stream interface module. As will be described further herein, the programming of the input equalizer 1002, the limiting amp 1004, the clock and data recovery circuit 1006, and output pre-emphasis circuit 1008 of the signal conditioning circuit 312 depends upon the fact that it resides in the TX path. Alternately, the signal conditioning circuit 306 receives the TX data at point X on the line side of the high-speed bit stream interface module. Thus, the programming of the input equalizer 1002, the limiting amp 1004, the clock and data recovery circuit 1006, and output pre-emphasis circuit 1008 of the signal conditioning circuit 306 depends upon the fact that it resides in the RX path.

As was illustrated in FIG. 2A, ISI jitter is generated from point A to point B and from point C to point D due to band limitations of the copper traces of the PCB 100. Also if the line side media is a copper cable and not an optical fiber, ISI will be present at the receiver input at point X. Thus, according to the present invention, the signal conditioning circuit 312 removes ISI due to bandwidth limitations of the PCB 100 in the TX path. Further, according to the present invention, the signal conditioning circuit 306 removes ISI caused by copper media on the RX path. Because both signal conditioning circuits 306 and 312 use the same integrated circuit, the input equalizer 1002, the limiting amp 1004, and the clock and data recovery circuit 1006 can each be controlled independently depending on the input conditions and application to remove ISI jitter.

The advantages of such approach are that (1) it allows longer traces on the PCB 100 between C and D and/or cheaper dielectric material for the board construction; (2) it reduces the amount of unfiltered DJ transferred from point C to the transmit point Y; (3) integration of the equalizer 1002, in the same device with the limiting amplifier 1004 and CDR 1006 allows a considerable area saving which is critical in small form factor modules; and (4) the possibility of disabling the operation of the equalizer 1002 and limiting amplifier 1004 independently from the CDR 1006 allows power saving in case they are not needed.

According to another aspect of the present invention, the output pre-emphasis circuit 1008 is employed to precondition the output bit stream at point A'. Referring to both FIGS. 2-4 and 10, the signal path on the PCB 100 from point A to point B is also subject to the bandwidth limitations of the board traces. Further, because the signal conditioning circuit 306 produces the RX bit stream right before the connector between the module and the PCB 100, the RX bit stream is prone to reflections due to the connector itself at point A'. Reflection of high frequency components of the bit stream, due to the degradation at high frequency of the S11 parameters of the connector itself, generates another form of deterministic jitter that can reduce the system performance. Given a certain connector, with a certain S11 characteristics the higher the frequency content of the data the higher the jitter generated. Hence, depending on the characteristic of connectors and traces a different shaping of the transmitted spectrum is needed.

Also, the swing requirement is different at point A than it is at point Y. At point A, in the case of short PCB 100 traces, small amplitude can suffice to drive the signal across to the communication ASIC 104C. However, smaller amplitude is actually beneficial because it decreases EMI (electromagnetic interference). At point Y, larger amplitude is needed to drive the laser or directly the line in case a copper cable is used. Because the Common Mode Logic (CML) drivers of the output of the module 102A drive 50-ohm terminations, halving the driver swing will also half the power dissipation of the driver itself.

Thus, according to the present invention, the output pre-emphasis circuit 1008 can be programmed with different transmitted signal spectrum shaping settings. Such programming allows the programmability of the output swing of the signal conditioning circuits 306 and 312. Further, the output pre-emphasis conditioning circuit 1008, in the case of poor high frequency reflection response of the connectors at point D', can be programmed in order to reduce the bandwidth of the bit stream. Therefore reflection due to the connector is decreased until the amount of ISI generated by the circuit itself plus the ISI generated by the PCB 100 traces is equal to the ISI generated by reflection in the connector. In the case of good high frequency response of the connector, the output pre-emphasis circuit will be programmed to increase the high frequency content of the transmitted bits stream in order to compensate for high frequency loss along the traces of the PCB 100, thus increasing the maximum supportable trace length.

If EMI (electromagnetic interference) due to sharp signal edges is a concern, the output pre-emphasis conditioning circuit 1008 will be used to reduce high frequency content of bit stream traveling on the PCB 100 to the communication ASIC 104A. The output pre-emphasis conditioning circuit 1008 can be disabled and turned off if not needed in order to save power and to reduce head production. This approach is superior to simple pre-emphasis because it considers also the case when it is beneficial to filter to reduce the high frequency content of the transmitted signal.

Referring FIGS. 2, 3, 4, and 10, the sensitivity requirements for the signal conditioning circuits 306 and 312 at points X and D' are different. If interfacing with optical fiber (as shown in FIG. 3) very small amplitude signal must be detected properly at point X. At point D (and D') instead the bit stream travels from the ASIC across the PCB 100 traces and high sensitivity is not required. The sensitivity of the signal conditioning circuits (306 and 312) is determined by the gain of the limiting amplifier 1004 at the input to the CDR 1006. Generally higher limiting amplifier 1004 gain comes at the cost of higher power consumption. A limiting amplifier 1004 with a sensitivity of few mV accounts for 50% of the power consumption of a signal conditioning circuit (312 or 306). With the same signal conditioning circuit used as either 306 or 312, therefore, power in the limiting amplifier 1004 of signal conditioning circuit 312 is wasted because its required sensitivity is small as compared to the required sensitivity of the limiting amplifier 1004 of signal conditioning circuit 306.

Figure 21:
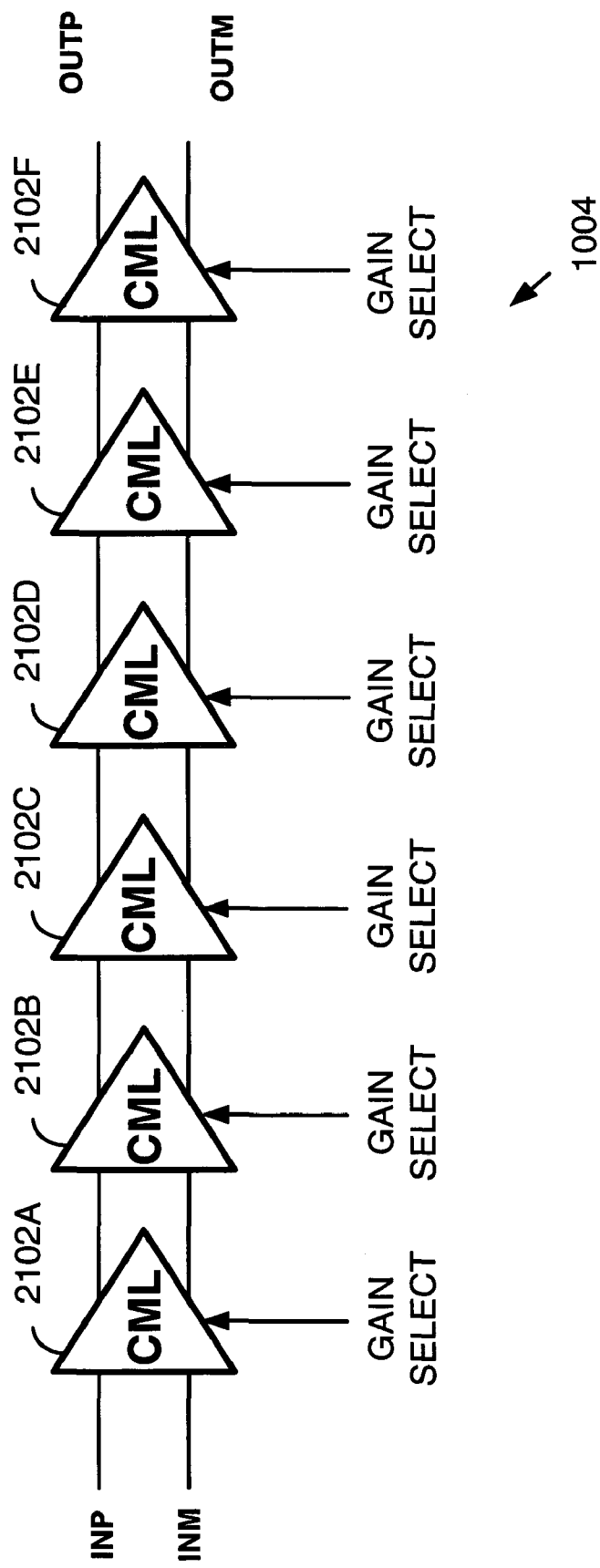
FIG. 21 is a block diagram illustrating a limiting amp 1004 constructed according to the present invention.
Figure 22:
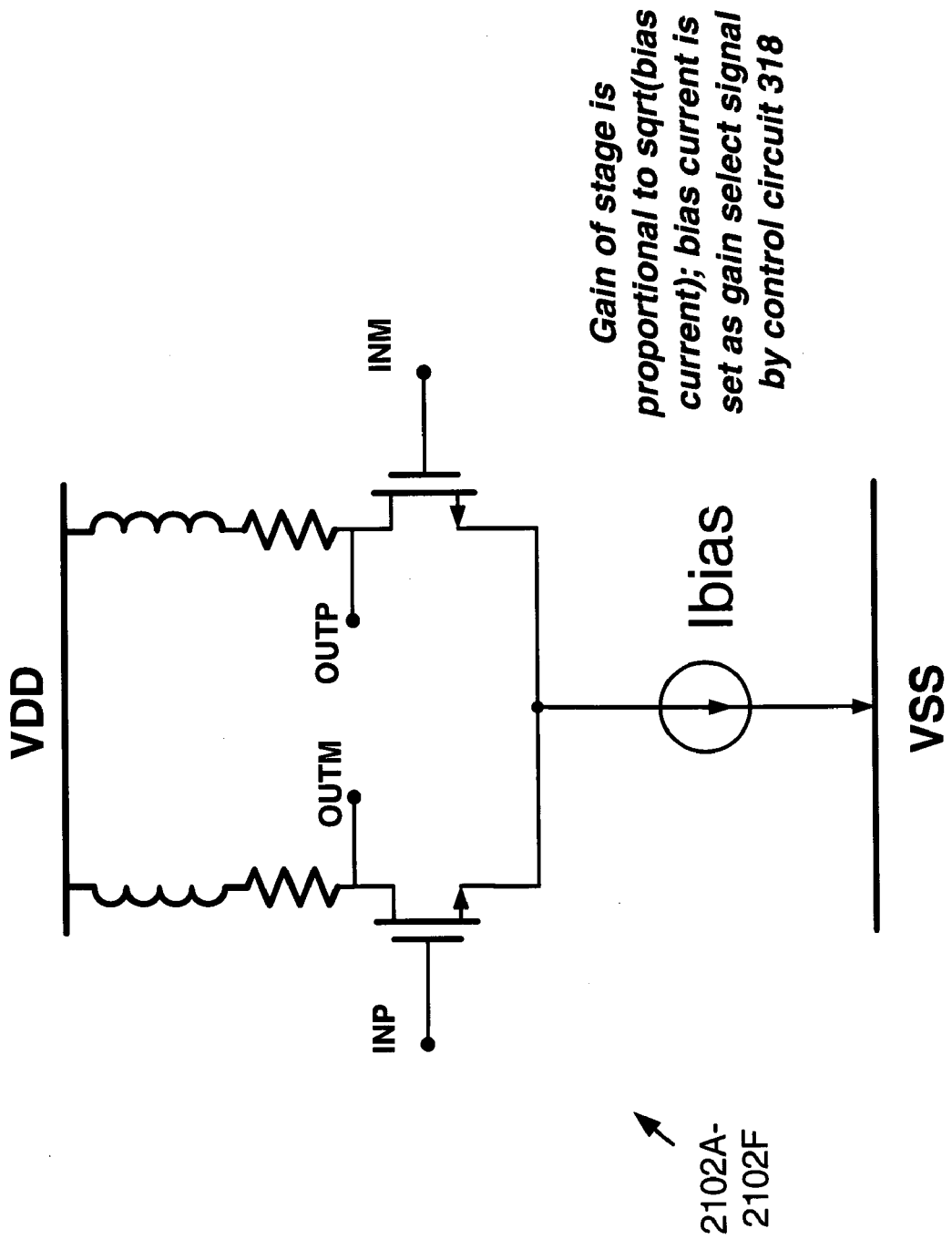
FIG. 22 is a schematic diagram illustrating a common mode logic stage of the limiting amplifier of the signal conditioning circuit of the present invention.

According to the present invention, the input sensitivity of the limiting amplifier 1004 is programmable. Therefore, the sensitivity (and power consumption) of the limiting amplifier 1004 may be controlled to find the best use of the signal conditioning circuit 312 or 306 in which the limiting amplifier resides. As will be described further with reference to FIGS. 14, 21, and 22, varying the bias current of the limiting amplifier to change its gain is performed. For example, we will take a limiting amplifier composed of a number of CML buffers as is shown in FIGS. 21 and 22. Each CML buffer provides a small signal gain, which will be proportional to $\sqrt{I_{bias}}$. Therefore decreasing the bias current of each CML stage by half will decrease the overall limiting amplifier sensitivity roughly by 30%.

Referring again to FIGS. 2-4 and 10, jitter tolerance and jitter transfer requirements are different for the TX path and the RX path. In a Phase Locked Loop (PLL) based single loop CDR 1006, jitter tolerance and jitter generation are related. A certain amount of jitter on the input data will be tracked (or tolerated) up to the PLL bandwidth. Also, up to the PLL bandwidth, all of the jitter that appears at the input will be transmitted to the output. Smaller tracking bandwidth results in a smaller amount of jitter being transferred to the output. However, the tracking bandwidth cannot be so small so that the CDR 1006 is intolerant to jitter within an acceptable jitter range, i.e., will easily lose lock on the receive bit stream.

Referring particularly to FIG. 2A, point X resides at the line side interface. Thus, at point X, jitter tolerance has to be compliant with a supported operating standard, e.g., SONET, Gigabit Ethernet, etc. Thus, for point X, the PLL bandwidth of the CDR 1006 of the signal conditioning circuit 306 is determined by the appropriate operating specification. On the other hand, at point D (D'), data is received from the transmitter of the communication ASIC. In this case a typical communication ASIC system will employ an architecture like the one illustrated in FIG. 5A, in which the ASIC multiplexes and retimes the bit stream using a clean clock. This clean clock produced by the ASIC is obtained by filtering a clock generated in the receiver portion of the communication ASIC transceiver by a very narrow bandwidth PLL. This ASIC clock generation process operates so that the bit stream transmitted by the communication ASIC at point C has a relatively small jitter bandwidth, typically in the order of few KHz. Therefore jitter tracking bandwidth of the TX path signal conditioning circuit 312 is typically considerably smaller than the jitter tracking bandwidth of the RX path signal conditioning circuit 306 for the bit stream received at point X.

Thus, according to the present invention, the CDR 1006 includes a PLL that has a programmable PLL bandwidth. In such case, the bandwidth of the CDR 1006 PLL in the TX path may be reduced with respect to the CDR 1006 PLL of the RX path until noise generated by the PLL VCO is the dominant noise source. By being able to program the bandwidth of the PLL of the CDR 1006, a reduced amount of ISI jitter picked up from point C to point D via the PCB 100 trace will be transferred to point Y. Further, a reduced amount of noise generated by the VCO in the ASIC transmitter will be transmitted at point Y.

Figure 11:
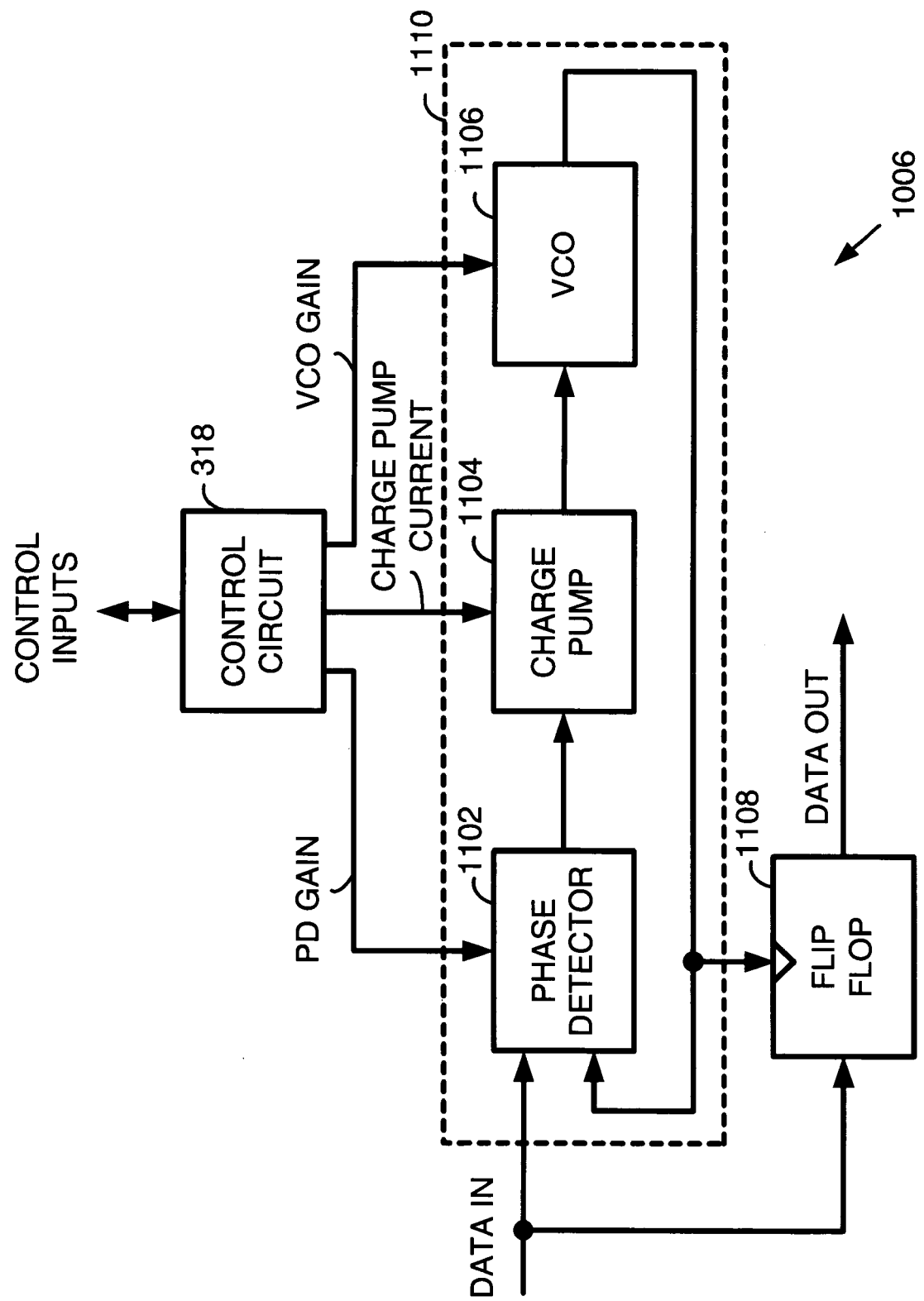
FIG. 11 is a block diagram illustrating a clock and data recovery circuit constructed according to the present invention.

FIG. 11 is a block diagram illustrating a clock and data recovery circuit constructed according to the present invention. The CDR 1006 receives data in and produces data out. The CDR 1006 includes a PLL 1110 having a phase detector 1102, a charge pump 1104, and a voltage-controlled oscillator (VCO) 1106. The phase detector 1102 receives as its input the data in bit stream and the output of the VCO 1106. The output of the VCO 1106 is also used as a clock input to flip-flop 1108 to synchronize the data out with the output of the VCO 1106.

According to the present invention, the control circuit 318 controls the bandwidth of the PLL 1110 by controlling the phase detector 1102 gain, the charge pump 1104 current, and the VCO 1106 gain. Referring to FIG. 2A, and as previously described above, when separate instances of the CDR 1106 service the TX and the RX path, the TX and RX paths have different requirements with regard to the feed through of jitter from point D to point Y and from point X to point A. Thus, the bandwidth of the PLL 1110 of the CDR 1006 of the signal conditioning circuit 312 is set differently than the bandwidth of the PLL 1110 of the CDR 1006 of the signal conditioning circuit 306. With these settings differing, the manner in which the signal conditioning circuit 312 and the signal conditioning circuit 306 track jitter in their respective bit stream inputs differs as well.

Figure 12:
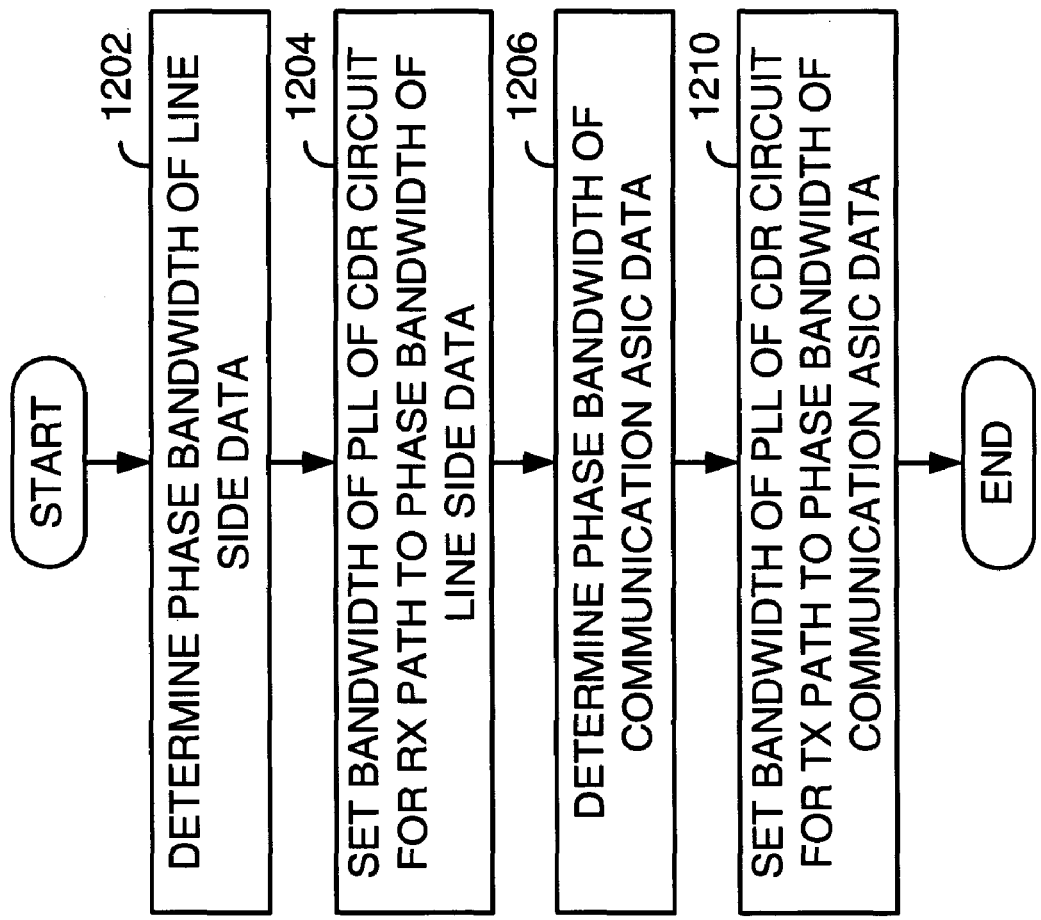
FIG. 12 is a logic diagram illustrating operations according to the present invention in setting the PLL bandwidth of the clock and data recovery circuits of the TX path and RX path signal conditioning circuits.

FIG. 12 is a logic diagram illustrating operations according to the present invention in setting the PLL 1110 bandwidth of the CDRs 1006 of the TX path and RX path signal conditioning circuits 306 and 312. As is generally known, the bandwidth of a PLL 1110 determines the ability of the PLL 1110 to track the phase of an input bit stream. Various operating standards describe the jitter bandwidth of a bit stream that is produced according to the operating standards. Further, devices such as the communication ASIC must also produce bit streams with particular jitter bandwidths. As an example of such characteristics, when the high-speed bit stream interface module supports a SONET line side standard, the phase bandwidth of the stream is approximately 8 megahertz. Further, the communication ASIC includes a multiplexer 504 (shown in FIG. 5) that produces output data having a particular phase bandwidth. An example of such a phase bandwidth is 5-10 kilohertz. In order to operate consistently with a coupled device it is desirable to tune the CDR 1006 of the signal conditioning circuits 312 and 306 of the high-speed bit stream interface module to correspond to the bandwidths of the corresponding data streams. In particular the jitter bandwidth of the operating standard must be met at point X, e.g., 8 MHz. On the other, with the jitter bandwidth of the communication ASIC 1004A multiplexer 504 known, it is desirable not to pass RJ introduced by the PCB 100 trace from point C to point D through to point Y.

Thus, according to FIG. 12, operation includes first determining the jitter bandwidth (phase bandwidth of the bit stream) of the line side data (step 1202). Such jitter bandwidth of line side data for example, would be according to the SONET specification approximately 8 megahertz. With this jitter bandwidth determined, operation includes setting the bandwidth of the PLL 1006 of the RX path signal conditioning circuit 306 of FIG. 10. With further reference to FIG. 11, the gain of the PLL 1110 is set by setting the phase detector 1102 gain, the charge pump 1104 current, and the VCO 1106 gain. As is generally known, the bandwidth of the PLL 1110 is a function of the phase detector gain, the charge pump current, and the VCO gain. According to one particular structure of a PLL, the bandwidth of the PLL 1110 is a linear function of each of these inputs. Thus, in the step 1204, the PLL of the clock and data recovery circuit 1006 of the signal conditioning circuit RX path 306 has these parameters set accordingly.

Next, the method of FIG. 12 includes determining the jitter bandwidth of communication ASIC data received at point D' by signal conditioning circuit 312 of FIG. 10. The multiplexer 504 of the communication ASIC 104A of FIG. 5 determines the jitter bandwidth of the communication ASIC data. Referring again to FIG. 12, once the jitter bandwidth of the communication ASIC data is determined, the bandwidth of the PLL of the clock and data recovery circuit 1006 of the TX signal conditioning circuit 312 is set to substantially match the jitter bandwidth of the communication ASIC multiplexer 504. Setting a PLL within the clock and data recovery circuit 1006 of the TX signal conditioning circuit 312 of FIG. 10 is performed in a similar manner to setting such jitter bandwidth of the PLL of the clock and data recovery circuit 1006 of the RX signal conditioning circuit 306.

Figure 13:
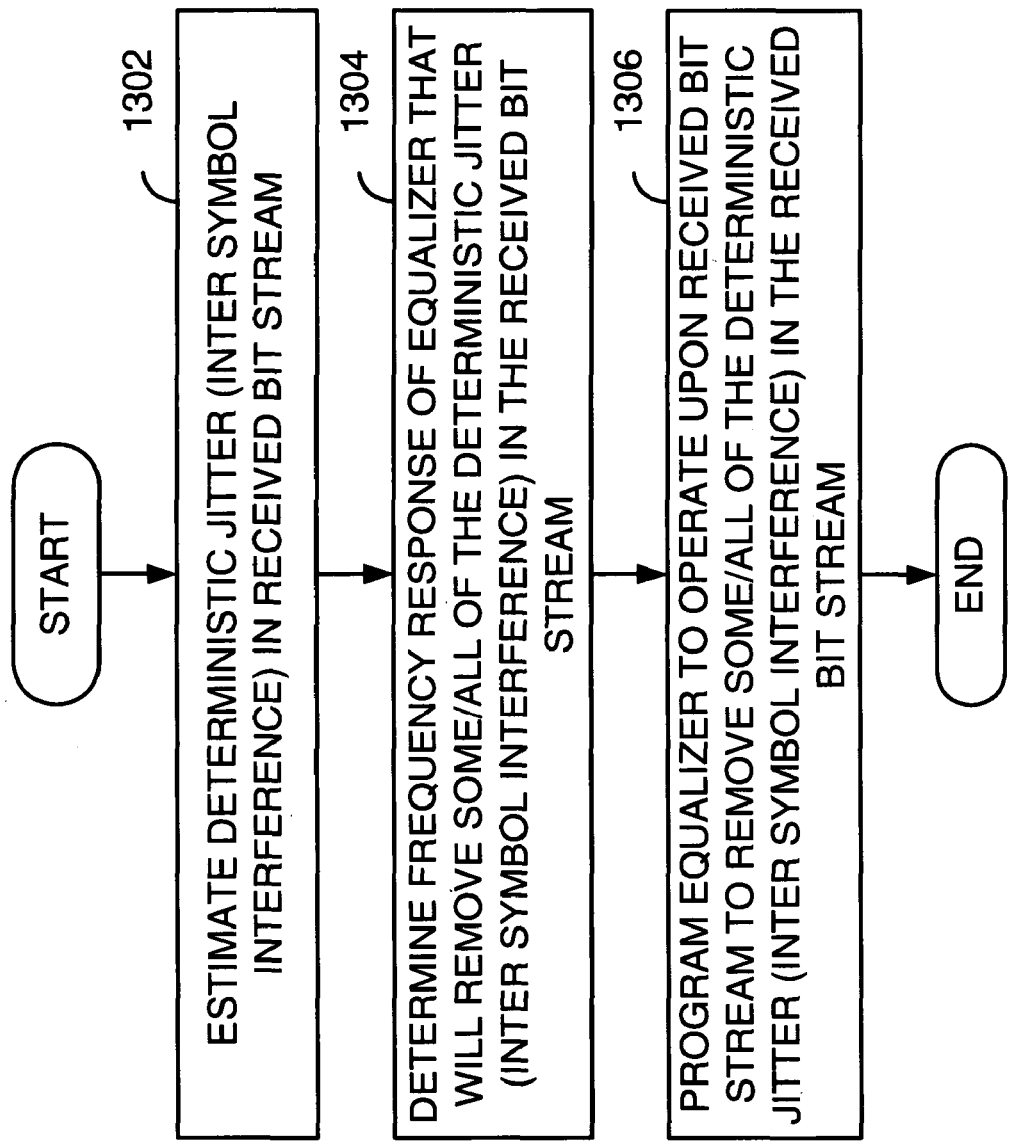
FIG. 13 is a logic diagram illustrating operation according to the present invention in programming an equalizer to compensate for deterministic jitter.

FIG. 13 is a logic diagram illustrating operation according to the present invention in programming an equalizer to compensate for deterministic jitter. As was previously described with reference to FIG. 5A through FIG. 9B, signal paths that carry bit streams will introduce random jitter and deterministic jitter into the bit stream. Random jitter in general cannot be compensated for via an equalization technique. However, deterministic jitter if characterized can be partially overcome via the equalization of the input bit stream by an equalizer 1002 of signal conditioning circuit 312 or 306 for example. Operation according to the present invention commences when the deterministic jitter in a received bit stream is estimated (step 1302). The estimation of deterministic jitter introduced by a given bit stream may be done theoretically or empirically.

For example, when the communication ASIC 104A and the high-speed bit stream interface module 102A mount upon PCB 100, the link between the high-speed bit stream interface module 102A and communication ASIC 104A will be characterized. Formed on the PCB 100 are an RX trace and a TX trace, each of which has a trace width, a trace depth, a trace distance, a trace path and a trace separation between the other of the TX trace or the RX trace. Further, the PCB 100 has additional board characteristics that will typically affect the propagation characteristics of the RX trace and the TX trace. With a standardized board format such as the FR4 standardized format, the signal propagation characteristics of the traces carrying the RX and TX data may be at least partially characterized. Typically, this characterization will be in the form of a frequency response of the respective trace and/or the manner in which the trace causes inter symbol interference, e.g., channel response, impulse response, etc. In a particular embodiment described herein with reference to FIG. 16, characterization of the signal path of the received bit stream is characterized in the frequency domain. In such case, equalization is also characterized in the frequency domain.

Operation continues wherein the frequency response of an equalizer that removes some or all of the deterministic jitter in the receive bit stream is determined (step 1304). As will be evident from the FIG. 17, the equalizer settings (that correspond to a linear filter) are determined to invert the deterministic jitter introduced by the signal path over which the bit stream is received. Then, the equalizer is programmed to operate upon the received bit stream to remove some or all of the deterministic jitter (step 1306). For example, equalizer 1002 of signal conditioning circuit 312 servicing the TX path will receive a bit stream from the communication ASIC. The trace carrying the TX data from the multiplexer of the communication ASIC to the equalizer 1002 of the signal conditioning circuit 312 will introduce deterministic jitter. The equalizer 1002 of the signal conditioning circuit 312 of FIG. 10 is therefore programmed at step 1306 to operate upon the received bit stream to remove some or all of the deterministic jitter.

Likewise, equalizer 1002 of signal conditioning circuit 306 is programmed to remove some or all of the deterministic jitter in the RX bit stream from the line side interface. The line side interface may also be characterized similarly to the manner in which the communication ASIC side of the interface is characterized to determine the deterministic jitter.

Figure 14:
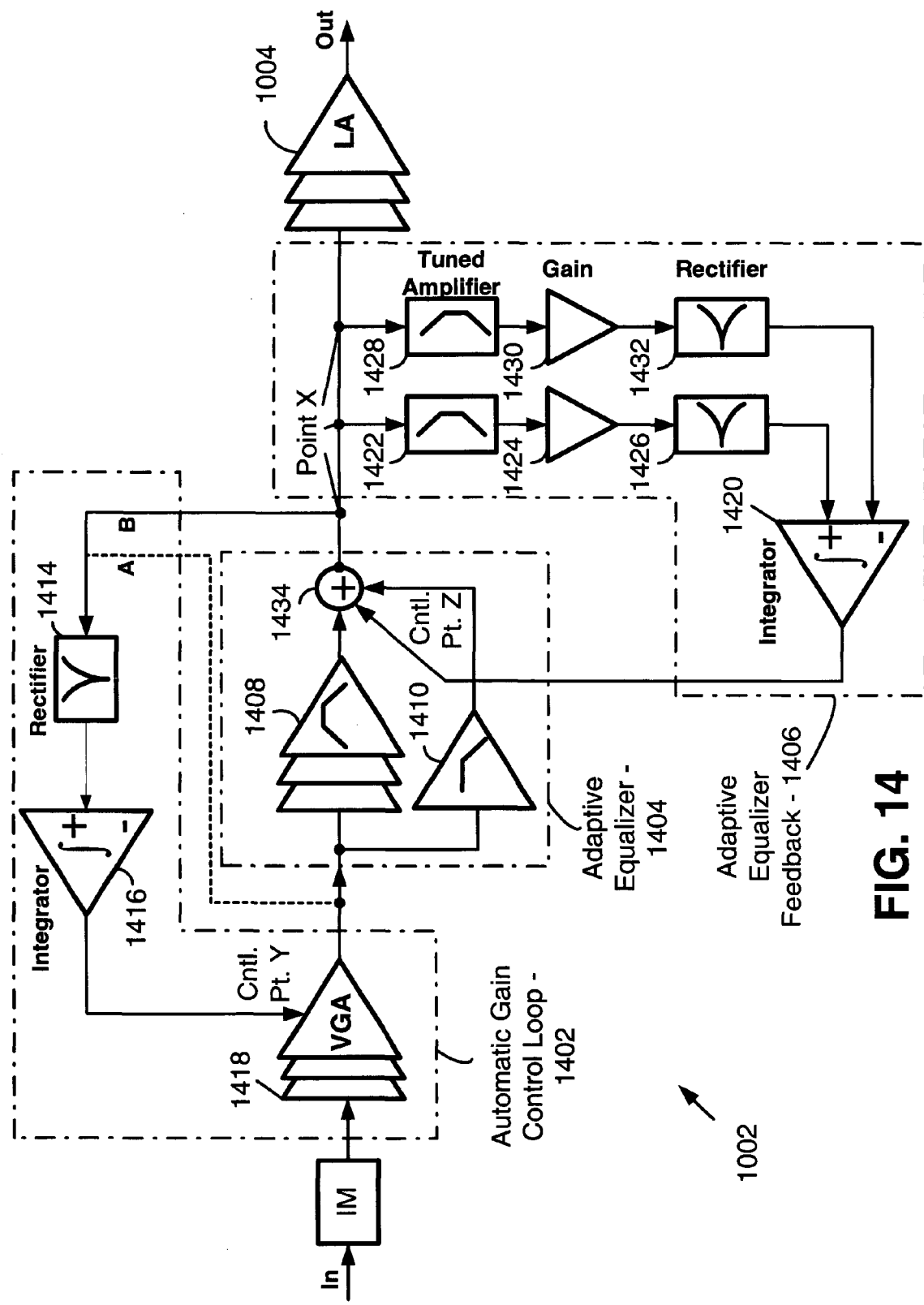
FIG. 14 is a block diagram illustrating one embodiment of an equalizer and a limiting amp of a signal conditioning circuit constructed according to the present invention.

FIG. 14 is a block diagram illustrating one embodiment of an equalizer and a limiting amp of a signal conditioning circuit constructed according to the present invention. As is shown, the equalizer 1002 includes an Automatic Gain Control (AGC) loop 1402, an adaptive equalizer 1404, and an adaptive equalizer feedback 1406. The AGC loop 1402 includes a plurality of variable gain amplifiers 1418 that adjust the amplitude of a received bit stream and a feedback control loop that includes a rectifier 1414 and an integrator 1416. The feedback control loop receives as its input the output of the adaptive equalizer 1404 and controls the gain of the plurality of cascaded variable gain amplifiers 1418.

Adaptive equalizer 1404 includes a constant gain low pass filter 1410 and a plurality of cascaded tuned amplifiers 1408.

The structure of the cascaded tuned amplifiers 1408 will be described further with reference to FIG. 15. The adaptive equalizer feedback 1406 includes an integrator 1420 that receives its inputs from separate signal paths, each of which receive as its input the output of the adaptive equalizer 1404. The first signal path includes tuned amplifier 1422, gain stage 1424, and rectifier 1426 and couples to the positive input of the integrator. The second signal path includes tuned amplifier 1428, gain stage 1430, and rectifier 1432 and couples to the negative input of the integrator. The output of the adaptive equalizer 1404 also serves as the input to the limiting amplifier 1004 that includes a plurality of gain stages that will be described further with reference to FIGS. 21 and 22.

The equalizer 1002 of FIG. 14 operates according to the following principles: (1) The input signal is amplified and its amplitude is held constant by the AGC loop 1402; (2) The output of the AGC loop 1402 is fed to two amplifying paths. A first amplifying path includes a low pass filter 1410 that has a flat band response with a −3dB BW>Nyquist and a second amplifying path that includes either band pass or high pass characteristics.

Figure 16:
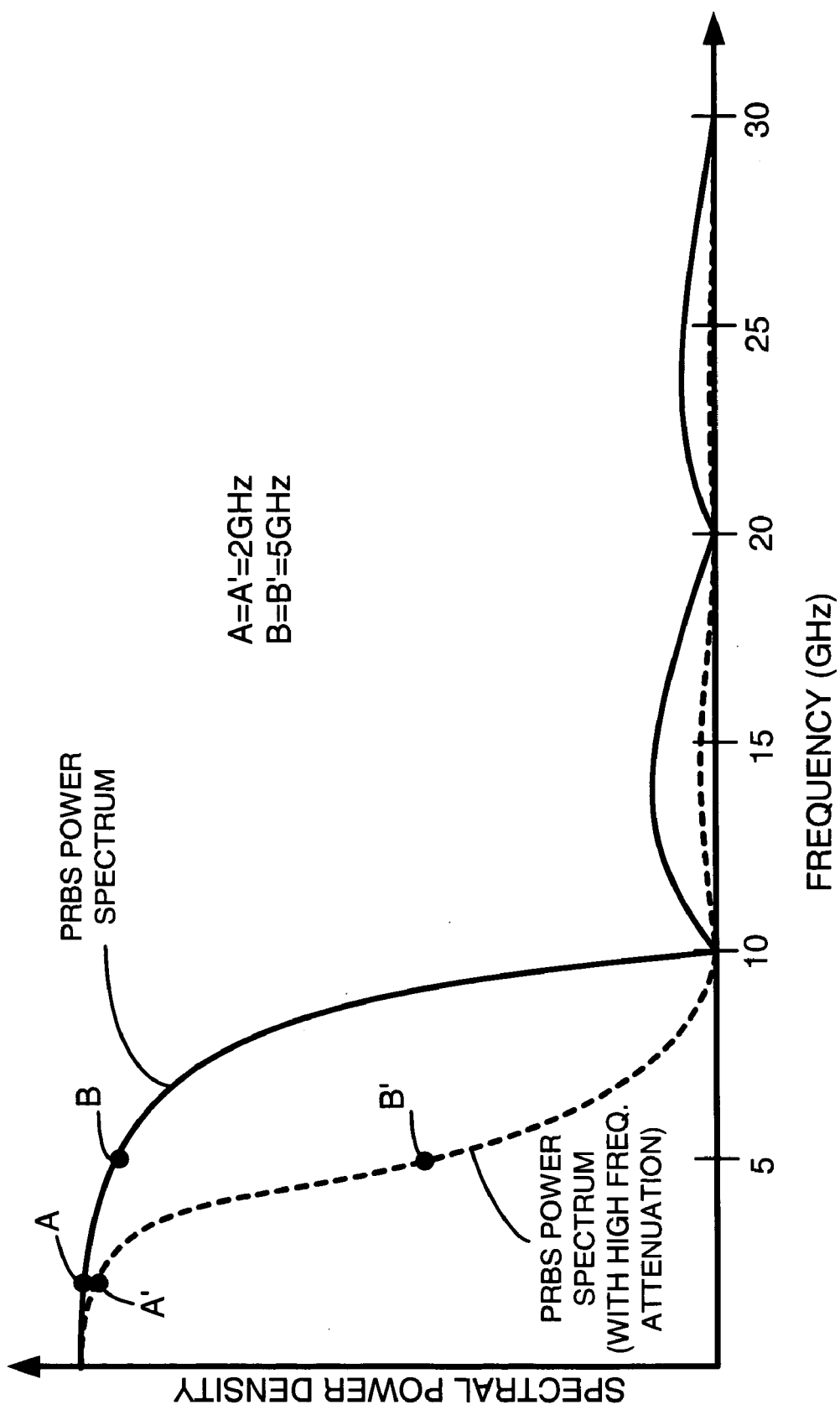
FIG. 16 is a graph illustrating the theoretical power spectrum of a Pseudo Random Bit Stream signal (PRBS) and the power spectral density of a PRBS signal with high frequency attenuation.

As described with reference to FIG. 14, the second path includes the cascaded tuned amplifiers 1408; (3) The two outputs of the two signal paths of the adaptive equalizer 1404 are summed by a variable gain summing circuit 1434 that is controlled by the adaptive feedback equalizer circuit 1406; (4) The power of the signal by the adaptive equalizer 1404 is measured at two frequency points $f_1$, $f_2$ with $f_2 > f_1$ by the adaptive equalizer feedback 1406 (due to tuning of tuned amplifiers 1422 and 1428) and the ratio of the two power $P(f_1)/P(f_2)$ measurements is compared after being separately gained by gain stages 1424 and 1430, respectively. The manner in which this is done is illustrated in FIG. 16 and shows that for a 10 GHz bit stream, these frequencies may be selected as 2 GHz and 5 GHz. The points $f_1$, and $f_2$ are referred to as points A and B in FIG. 16. This ratio will indicate the high frequency attenuation in the bit stream. In such example, the tuned amplifier 1422 and 1428 center frequencies are chosen accordingly.

In the case of an ideal PRBS signal, the ratio will be equal to the reference and the adaptive equalizer 1404 would provide not frequency adjustment. Higher, if the signal is degraded by the low pass effects (high frequency attenuation) of the transmission path, e.g., point C to D, than the ratio will be higher than the reference. The comparison result causes the integrator 1420 to provide a feed back signal that adjusts the variable gain summing circuit 1434. If the PRBS signal high frequency components are degraded, the gain of the high pass path 1408 is increased until the ratio becomes equal to the reference and the high frequency content of the PRBS signal is restored, thus eliminating most of the ISI. In such case, the shape of the spectrum output by the equalizer will match as closely as possible the spectrum of the ideal PRBS signal.

The equalizer 1002 is a linear equalizer. That means that the processing on the signal is linear. In order for the above system to function properly, the signal must be maintain reasonably linear along the path. Clamping the signal at a rail would distort the signal spectrum and lead to errors in the amount of equalization applied. Therefore the AGC loop 1402 is necessary. The feedback path of the AGC loop 1402 (the rectifier 1414 and the integrator 1416) monitors the signal amplitude at the output of the AGC 1402 and provides feedback to the VGA 1418 via the integrator 1416. The VGA 1418 thus maintains the output amplitude constant based upon the feedback.

An ideal amplitude detector would be a peak detector capable of detecting the max amplitude and storing it indefinitely. At very high speed any peak detector, due to circuit speed limitations, behaves in reality as a signal energy detector. Considering two PRBS input signals with the same amplitude, with the first transmitted with full Nyquist bandwidth and the second being low-pass filtered, the second signal will result in a lower value, as detected by the amplitude detector. Therefore for this application, signals with the same amplitude but with different loss at high frequency would force the AGC loop 1402 to settle at different amplitude levels for the signals.

Strongly attenuated signals will actually tend to saturate the AGC loop 1402 and therefore be clamped. This is unacceptable if linear operation of the adaptive equalizer 1404 must be maintained. Thus, according to the present invention, the sensing point of the amplitude detector is moved from the output of the AGC loop 1402 (shown as dotted path A) to the output of the adaptive equalizer 1404 (shown as path B). In doing so, the amplitude detector senses a signal already equalized and the above-described result is precluded.

The configuration described above consists in two feedback loops sensing at one point X and controlling in two different points, control point Y (at the VGA 1418) and control point Z (at variable gain summing circuit 1434). If both feedback loops have gain in the same frequency range the stability of the whole system would be compromised. Such is not the case with the present invention because the adaptive equalizer 1404 is composed of a first path for the signal which is a flat response buffer (low pass) 1410 with a bandwidth>Nyquist, and a second path which is realized with a cascade of tuned amplifiers 1408. The tuned amplifiers are realized with Common Mode Logic (CML) buffers with inductive loads. The tuned amplifiers have excellent DC rejection and therefore the DC gain of the adaptive equalizer 1404 does not change with the amount of equalization applied. Thus, the adaptive equalizer 1404 doesn't interfere with the AGC loop 1402. The structure of each of these tuned amplifiers is illustrated in FIG. 15.

Figure 15:
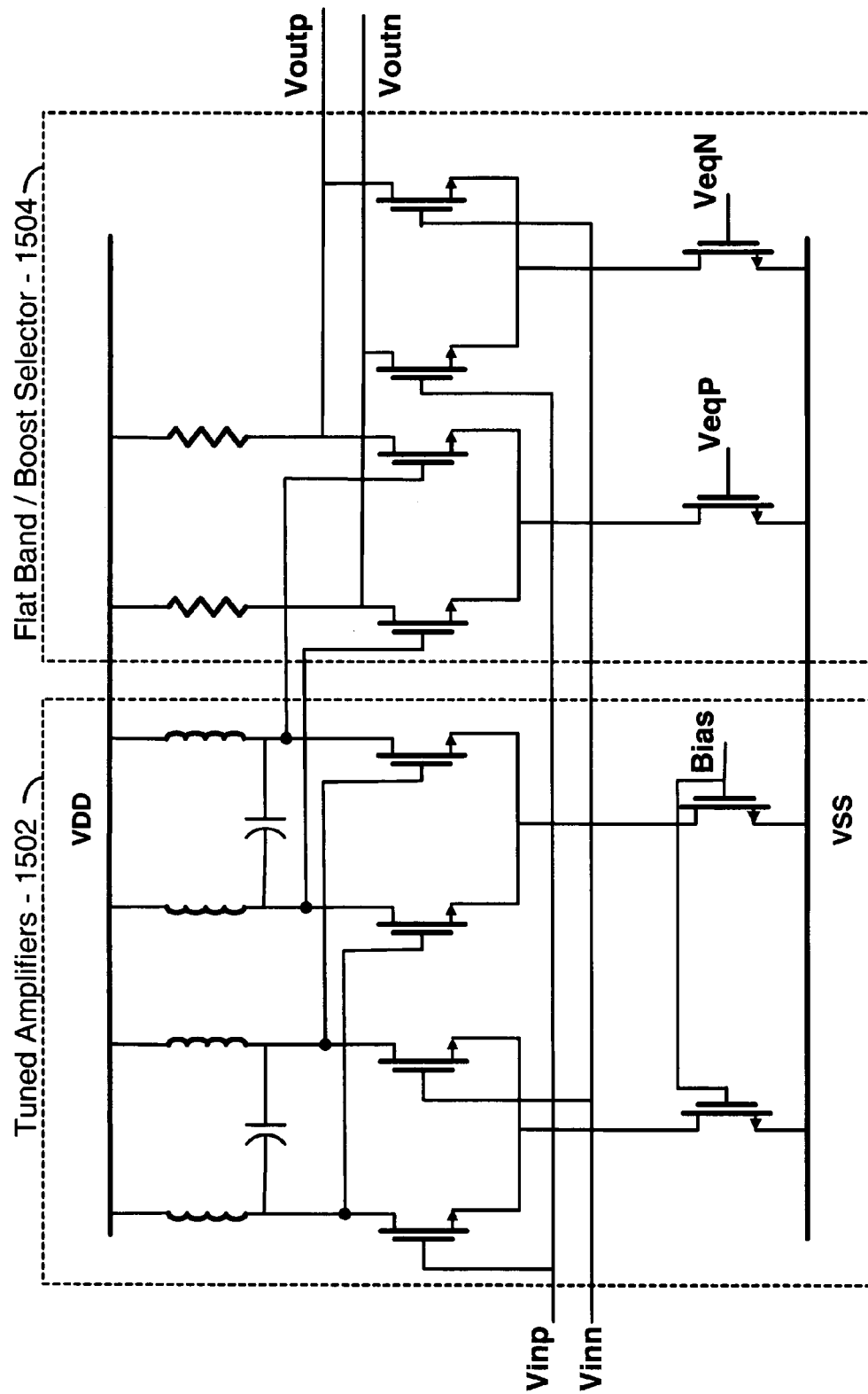
FIG. 15 is a schematic diagram illustrating the structure of one of the cascaded tuned amplifiers of the equalizer of FIG. 14.

FIG. 15 is a schematic diagram illustrating the structure of one of the cascaded tuned amplifiers 1408 of the adaptive equalizer 1404 of FIG. 14. The cascaded tuned amplifier includes a tuned amplifier stage 1502 and a flat band/boost selector stage 1504. Based on a bias input to the tuned amplifier 1502, the tuned amplifier provides a gain of the cascaded tuned amplifier. The flat band/boost selector 1504 receives VeqP and VeqN as the inputs and receives the output of the tuned amplifier 1502. The flat band/boost selector introduces a boost into the signal path. The characteristics of the tuned amplifier stage 1502 and the flat band/boost selector stage 1504 of the cascaded tuned amplifier 1408 illustrated (as well as of the characteristics of the constant gain low pass filter 1410) are determined based upon the bit rate of the serviced bit stream and also the expected manner in which the serviced bit stream is affected by the PCB on the board side and/or the media on the line side. The manner in which this is performed is straightforward.

FIG. 16 is a graph illustrating the theoretical power spectrum of a Pseudo Random Bit Stream signal (PRBS) and the power spectral density of a PRBS signal with high frequency attenuation. Referring back to FIG. 13, at step 1302, it was required that the deterministic jitter in a receive bit stream is estimated. One technique for doing such estimation is to compare the power spectrum of a received pseudo random bit stream with the theoretical power spectrum of a pseudo random bit stream. Such determination may be done by looking at magnitudes of the power spectrum at particular frequencies, e.g., at points A and B of the theoretical power spectrum of the PRBS. Then, the actual magnitudes of the attenuated PRBS power spectrum at points A' and B' on the frequency spectrum are also determined. Based upon the relationship of A' and B' to A and B, the high frequency attenuation of the pseudo random bit stream is determined. This high frequency attenuation corresponds significantly to the deterministic jitter in the receive bit stream. As was previously described with reference to FIG. 14, the adaptive equalizer feedback 1406 uses this relationship as feedback to the adaptive equalizer 1404. The adaptive equalizer 1404 uses this feedback to adjust its frequency response.

Figure 17:
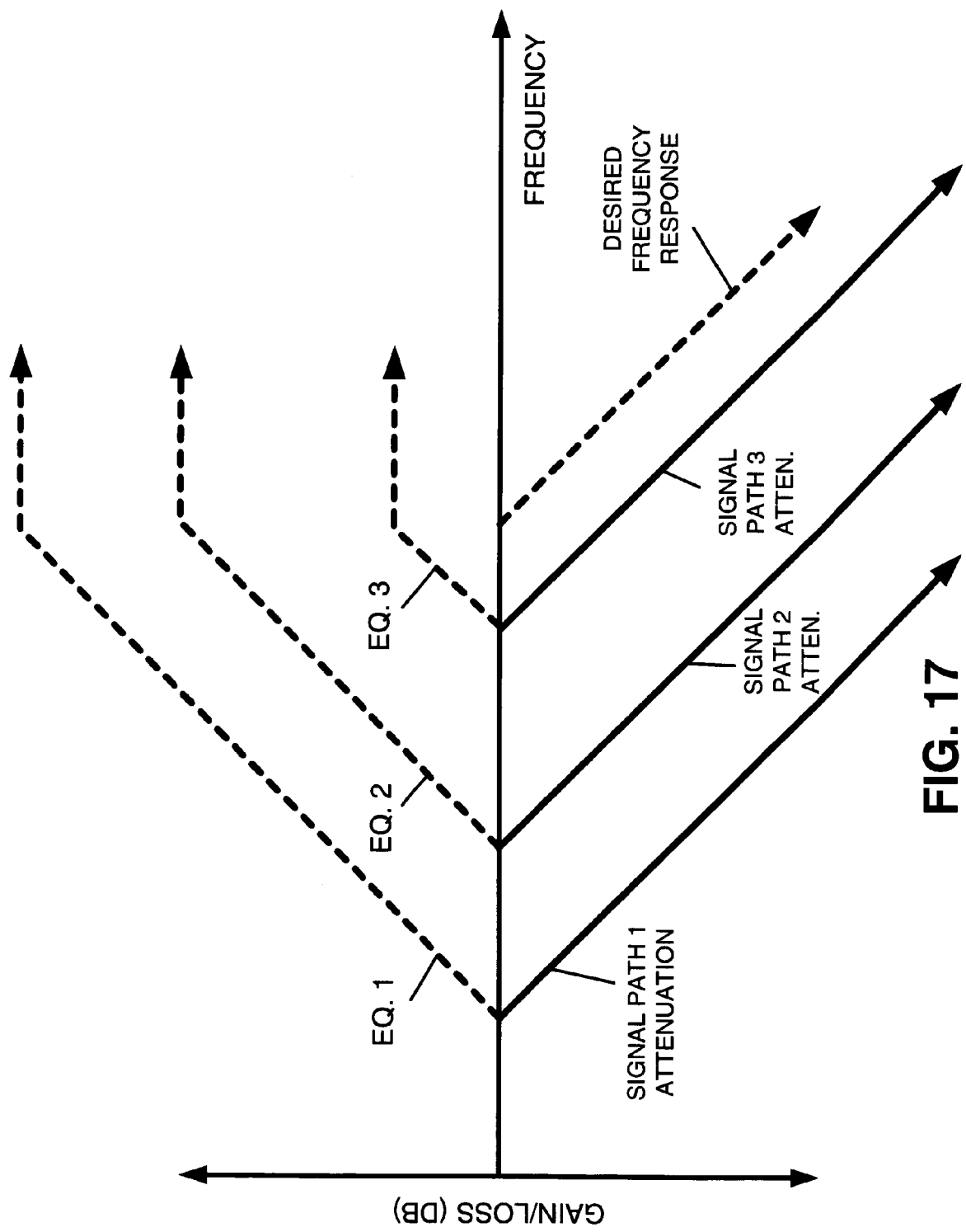
FIG. 17 is a graph illustrating various signal path attenuation properties and equalizer frequency responses corresponding to the signal path attenuation properties.

FIG. 17 is a graph illustrating various signal path attenuation properties and equalizer frequency responses corresponding to the signal path attenuation properties. As illustrated in FIG. 17, one signal path attenuation characteristic is addressed via equalizer setting 1. Further, another signal path attenuation setting is addressed by equalizer setting 2. Finally, a third signal path attenuation setting is addressed by equalizer setting 3. As is evident, appropriate equalizer settings will partially/fully invert the frequency response to produce a desired frequency response for any high frequency attenuation caused by the signal path. Such a desired frequency response is shown.

Figure 18:
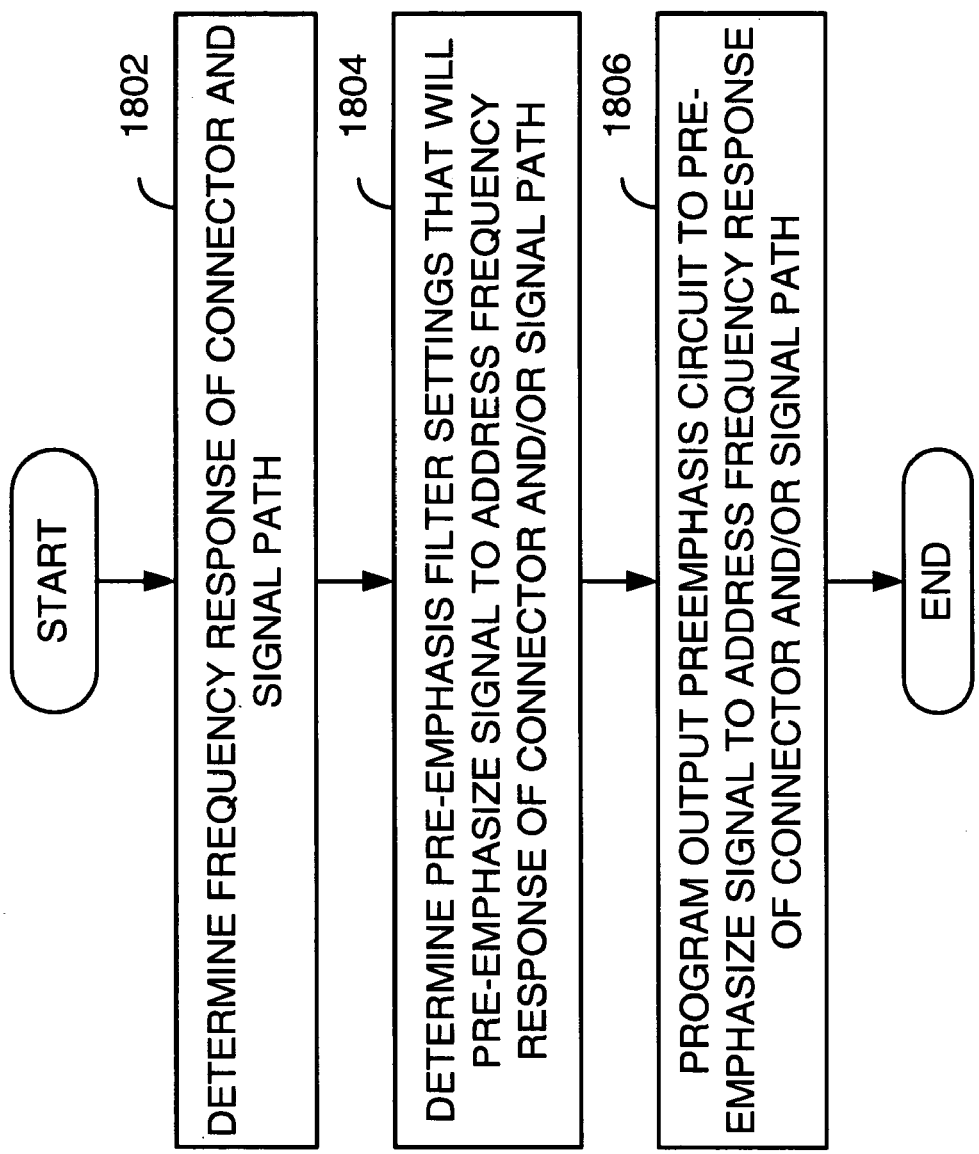
FIG. 18 is a logic diagram illustrating operation according to the present invention in determining pre-emphasis circuit settings for a particular signal path and connector combination.

FIG. 18 is a logic diagram illustrating operation according to the present invention in determining pre-emphasis circuit settings for a particular signal path and connector combination. Operation commences wherein the frequency response of a combined connector and signal path are determined (step 1802). For example, one combination of signal path and connector relate to the RX path serviced by the high-speed bit stream interface module 102A. Such connector and signal path couple the high-speed bit stream interface module 102A to the PCB 100 for further coupling the signals to the communication ASIC 104A. The connector in the PCB 100 board trace have there own unique signal propagation characteristics. Thus, at step 1802, the combined characteristics of this signal path are determined.

Likewise, at step 1802, the frequency response of a connector and a signal path may also be determined for the line interface of the high-speed bit stream interface module 102A. Once the frequency response of the connector and signal paths are determined, operation proceeds to step 1804 in which pre-emphasis circuit settings that will be employed by the pre-emphasis circuit are determined. As was the case of the equalizer 1002, the output pre-emphasis circuit 1008 settings are intended to pre-emphasize the signal to compensate for signal path characteristics. Once these output pre-emphasis circuit settings are determined, the output pre-emphasis circuit 1008 is programmed to pre-emphasize the signal to pre-compensate for the frequency response of the connector and signal path. Referring back to FIG. 10, output pre-emphasis circuit 1008 of signal conditioning circuit 312 is programmed to compensate for at least the line side connector. Likewise, output pre-emphasis circuit 1008 of signal conditioning circuit 306 is programmed to compensate for the characteristics of the connector and trace that couple the signal conditioning circuit 306 to the communication ASIC. The output pre-emphasis circuit 1008 may be constructed as a linear filter having a frequency response whose settings are selected by the control circuit 318 based upon the particular installation.

Figure 19:
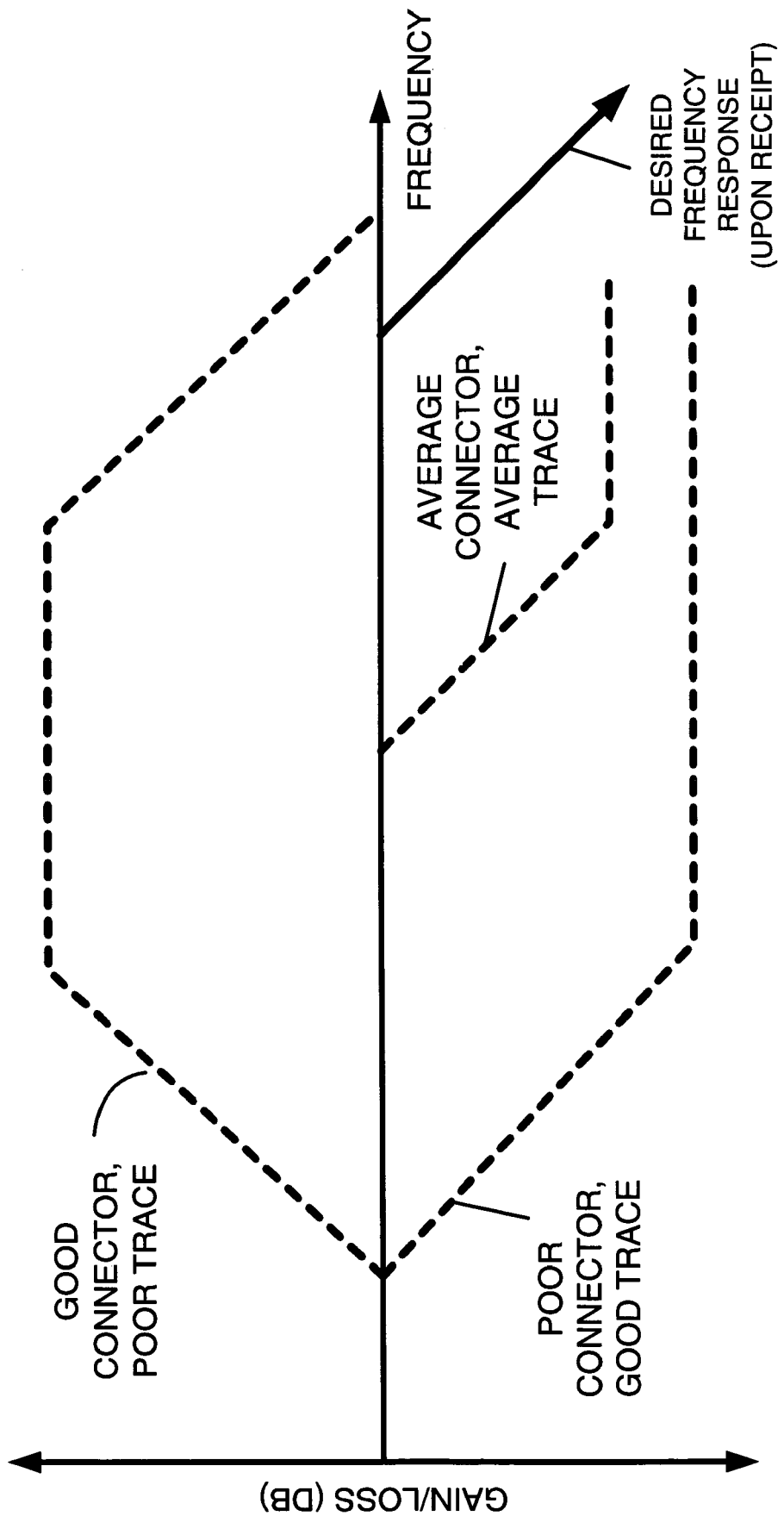
FIG. 19 is a graph illustrating various frequency responses of the connection between the high-speed bit stream interface module and the communication ASIC of the PCB.

FIG. 19 is a graph illustrating various frequency responses of the connection between the high-speed bit stream interface module 102A and the communication ASIC 104A of the PCB 100. The combination of the interconnection between the high-speed bit stream interface module 102A and the communication ASIC 104A includes the connector for the module 102A and the PCB 100 trace between the connector and the communication ASIC 104A. Three separate frequency response curves are shown in FIG. 19. A first frequency response curve illustrates a poor connector and a good trace. A second frequency response curve illustrates frequency response for an average connector and an average trace. Finally, a third frequency response curve illustrates the frequency response for a good connector in a poor trace. Based upon the frequency response of the signal path that will be addressed, the output pre-emphasis circuit 1008 of the signal conditioning circuit 306 will be programmed to precondition the signal in an inverted manner. By preconditioning the signal in a manner inverted to the frequency response of the signal path, theoretically, the signal will be received to have a spectrum corresponding to the PRBS spectrum.

Likewise, the output pre-emphasis circuit 1008 of the signal conditioning circuit 312 may be programmed to pre-compensate for the connector to the line side media and/or for to pre-compensate for the line side media itself. In this fashion, the pre-conditioned signal, after having been transmitted across the connector and/or the media will have a spectrum more similar to the PRBS spectrum than it would otherwise have. As the reader should appreciate, when a copper media is used on the line side, more pre-conditioning would typically be required than when an optical media is used.

Also shown if FIG. 19 is a desired frequency response for a received bit stream at the far end of connector/media or connector/trace being serviced. The frequency axis of FIG. 19 is not labeled. Such is the case because each particular connector/media or connector/trace will typically have a different frequency response. Further, this frequency response will typically be more complex than that as shown in FIG. 19. Thus, the graph of FIG. 19 is illustrative only. However, the teachings of the present invention provided partially by FIG. 19 will cause the design of an integrated circuit incorporating such teachings to be straightforward to one of skill in the art.

Figure 20:
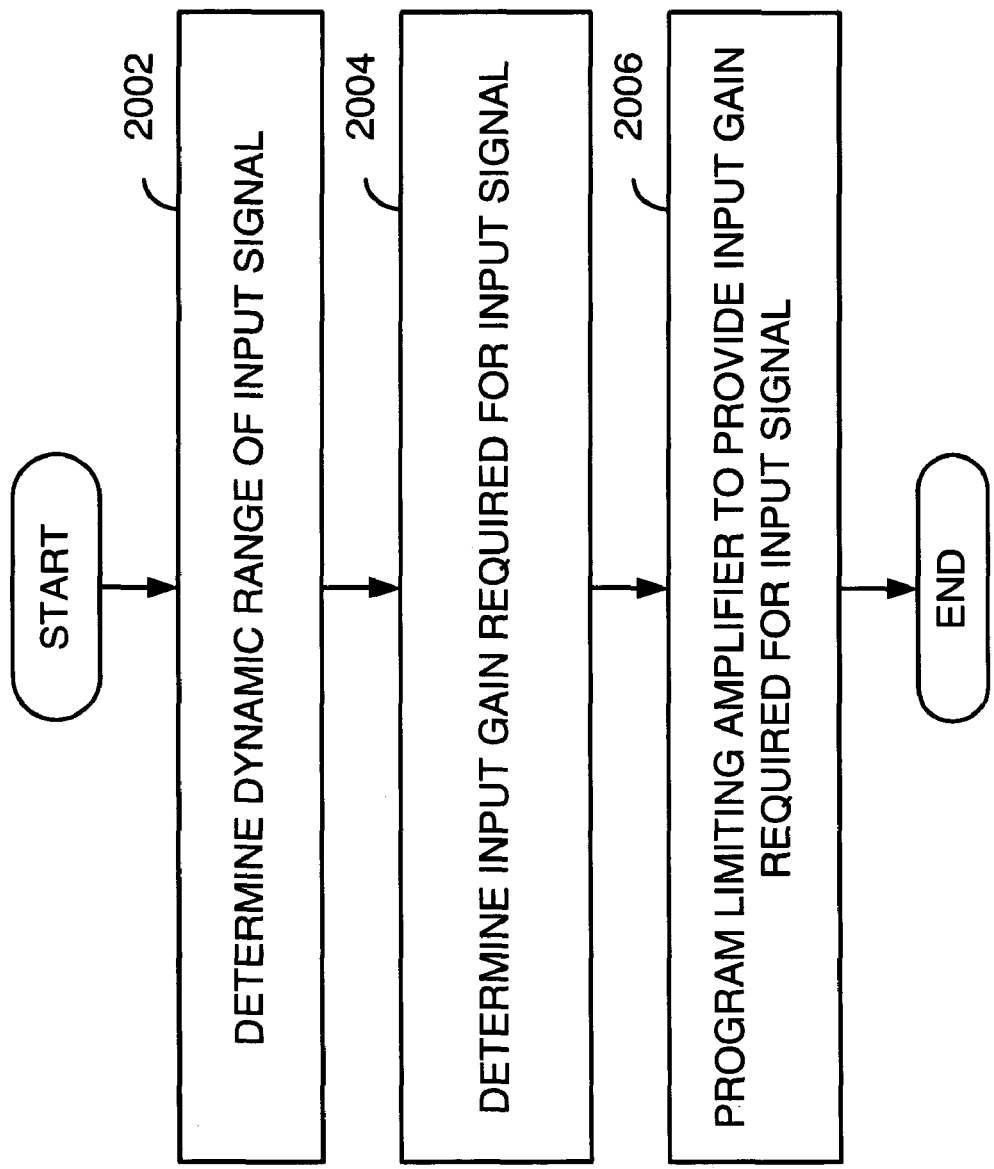
FIG. 20 is a logic diagram illustrating operation according to the present invention in programming the dynamic range of a limiting amplifier of the signal conditioning circuit of the present invention.

FIG. 20 is a logic diagram illustrating operation according to the present invention in programming the dynamic range of a limiting amplifier of the signal conditioning circuit of the present invention. Because the signal conditioning circuit of the present invention is employed both in the TX path and the RX path of the high-speed bit stream interface module 102A of FIG. 1, it must operate upon input bit streams having significantly different dynamic ranges. For example, when the signal conditioning circuit is employed to service the RX signal path of the high-speed bit stream interface module 102A such a signal conditioning circuit 306 of FIG. 10 illustrates, the input signal will be of a relatively low dynamic range. Further, when the signal conditioning circuit 312 of FIG. 10 is employed to service the TX path of the high-speed bit stream interface module 102A, the input signal has a relatively larger dynamic range. However, because the structure of the signal conditioning circuit is the same for both implementations, the limiting amp 1004 of the signal conditioning circuit must be capable of accepting varying different dynamic ranges.

Thus, according to the operation of FIG. 20, the limiting amp is programmed for its intended purpose. As a first operation, the dynamic range of the input signal is first determined (step 2002). Then, based upon the dynamic range of the input signal as expected, the input gain required for the input signals is determined (step 2004). Finally, the limiting amplifier is programmed to provide an input gain corresponding to the expected dynamic range on the input signal (step 2006).

FIG. 21 is a block diagram illustrating a limiting amp 1004 constructed according to the present invention. As is shown, the limiting amp 1004 includes a plurality of CML stages 2102A-2102F. Each of these CML stages 2102A-2102F receives a respective gain select signal. This gain select signal is employed to determine the gain for the respective stage. In the embodiment of FIG. 21, the control circuit 318 provides the gain select signal, with such control signal potentially differing for the signal conditioning circuit 306 as compared to the control signal provided to signal conditioning circuit 312.

FIG. 22 is a schematic diagram illustrating a common mode logic stage of the limiting amplifier 1004 of the signal conditioning circuit 312 or 306. The CML stage 2102A-2102F of FIG. 22 is cascaded with other CML stages as is illustrated in FIG. 21. The control signal for the CML stage illustrated in FIG. 22 is employed to set the Ibias current for the stage. As is generally known, the gain of such a CML stage is proportioned to the square root of the Ibias for the stage. Thus, the gain select signal as provided by the control circuit illustrated in FIG. 10 will determine the particular gain for the CML stage.

Figure 23:
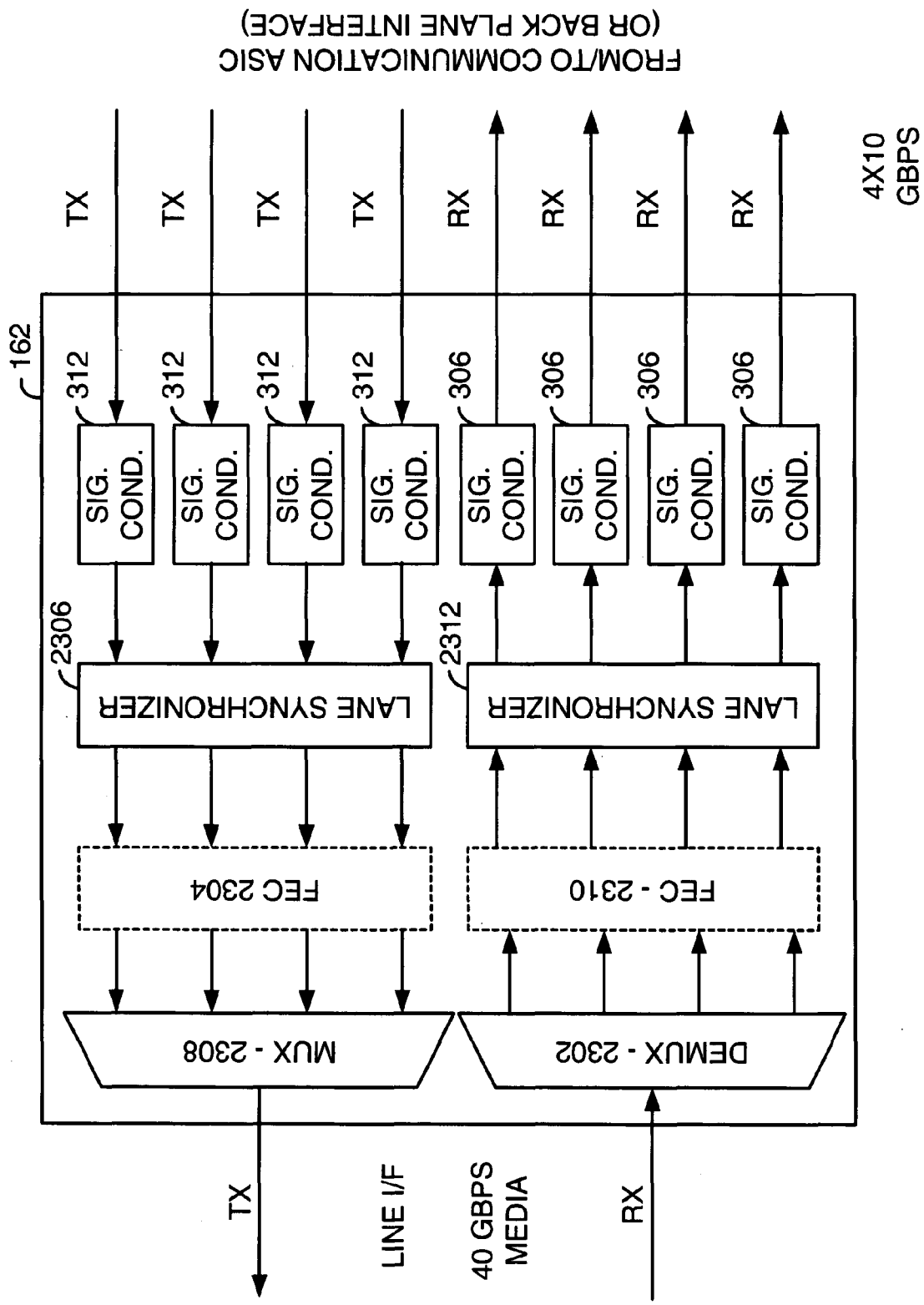
FIG. 23 is a block diagram illustrating a high-speed bit stream interface module constructed according to the present invention that services a line interface and an integrated circuit (or back plane interface)

FIG. 23 is a block diagram illustrating a high-speed bit stream interface module constructed according to the present invention that services a line interface and an integrated circuit (or back plane interface). In the embodiment, the high-speed bit stream interface module 162 includes a line side interface, a board side interface, at least one multiplexer 2308, at least one demultiplexer 2302, and a plurality of signal conditioning circuits 306 and 312. The line side interface services a line side media, receives a line side receive signal, and transmits a line side transmit signal. The board side interface services a plurality of transmit bit streams and a plurality of receive bit streams.

The at least one multiplexer 2308 multiplexes the plurality of transmit bit streams to produce the line side transmit signal. The at least one demultiplexer 2310 demultiplexes the line side receive signal to produce the plurality of receive bit streams. Finally, each of the plurality of signal conditioning circuits 306 and 312 services a respective bit stream of the plurality of transmit bit streams and the plurality of receive bit streams.

The high-speed serial bit stream interface 162 may further include a receive lane synchronizer 2312 that services the plurality of receive bit streams and a transmit lane synchronizer 2306 that services the plurality of transmit bit streams. The lane synchronizers 2312 and 2306 ensure that data carried by multiple bit streams is correctly reassembled upon receipt. In one embodiment, which will be described further with reference to FIGS. 25 and 26, the receive lane synchronizer 2312 operates by inserting at least one bit pattern into the plurality of receive bit streams while the transmit lane synchronizer 2306 operates by inspecting at least one bit pattern contained in the plurality of transmit bit streams and realigning the plurality of bit streams when required as determined by the inspection.

The high-speed serial bit stream interface may also include a receive Forward Error Correction (FEC) block 2310 that services the plurality of receive bit streams and a transmit FEC block 2304 that services the plurality of transmit bit streams. The FEC blocks 2310 and 2304 perform FEC operations according to a selected FEC scheme, e.g., Hamming Codes, Reed-Solomon Codes, etc.

Figure 24:
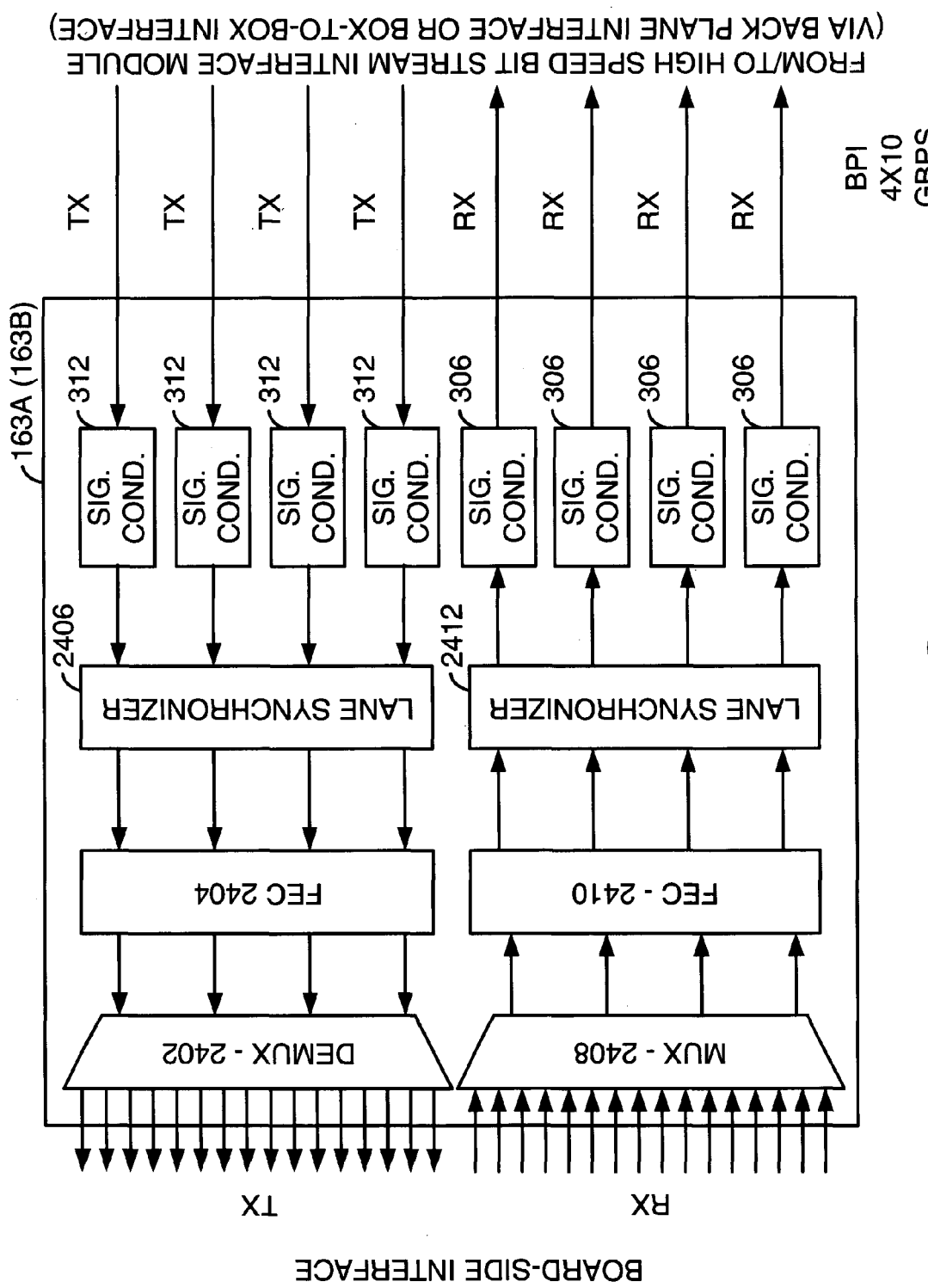
FIG. 24 is a block diagram illustrating a high-speed bit stream interface module constructed according to the present invention that services an integrated circuit and a back plane interface/box-to-box interface.

FIG. 24 is a block diagram illustrating a high-speed bit stream interface module 163A/163B constructed according to the present invention that services an integrated circuit and a back plane interface/box-to-box interface. The high-speed serial bit stream interface module 163A/163B includes a back plane/box interface, a board side interface, at least one demultiplexer 2408, at least one multiplexer 2402, and a plurality of signal conditioning circuits 306 and 312. The back plane/box interface services a first plurality of transmit bit streams and a first plurality of receive bit streams. The board side interface services a second plurality of transmit bit streams and a second plurality of receive bit streams. The at least one demultiplexer 2462 demultiplexes the first plurality of transmit bit streams to produce the second plurality of transmit bit streams. The at least one multiplexer 2408 demultiplexes the second plurality of transmit bit streams to produce the first plurality of transmit bit streams. Each of the plurality of signal conditioning circuits 306 and 312 services a respective bit stream of the first plurality of receive bit streams and the first plurality of transmit bit streams.

The high-speed serial bit stream interface 163A/163B may further include a receive lane synchronizer 2412 that services the plurality of receive bit streams and a transmit lane synchronizer 2406 that services the plurality of transmit bit streams. The lane synchronizers 2412 and 2406 ensure that data carried by multiple bit streams is correctly reassembled upon receipt. In one embodiment, which will be described further with reference to FIGS. 25 and 26, the receive lane synchronizer 2412 operates by inserting at least one bit pattern into the plurality of receive bit streams while the transmit lane synchronizer 2306 operates by inspecting at least one bit pattern contained in the plurality of transmit bit streams and realigning the plurality of bit streams when required as determined by the inspection.

The high-speed serial bit stream interface may also include a receive Forward Error Correction (FEC) block 2410 that services the plurality of receive bit streams and a transmit FEC block 2404 that services the plurality of transmit bit streams. The FEC blocks 2410 and 2404 perform FEC operations according to a selected FEC scheme, e.g., Hamming Codes, Reed-Solomon Codes, etc.

Figure 25:
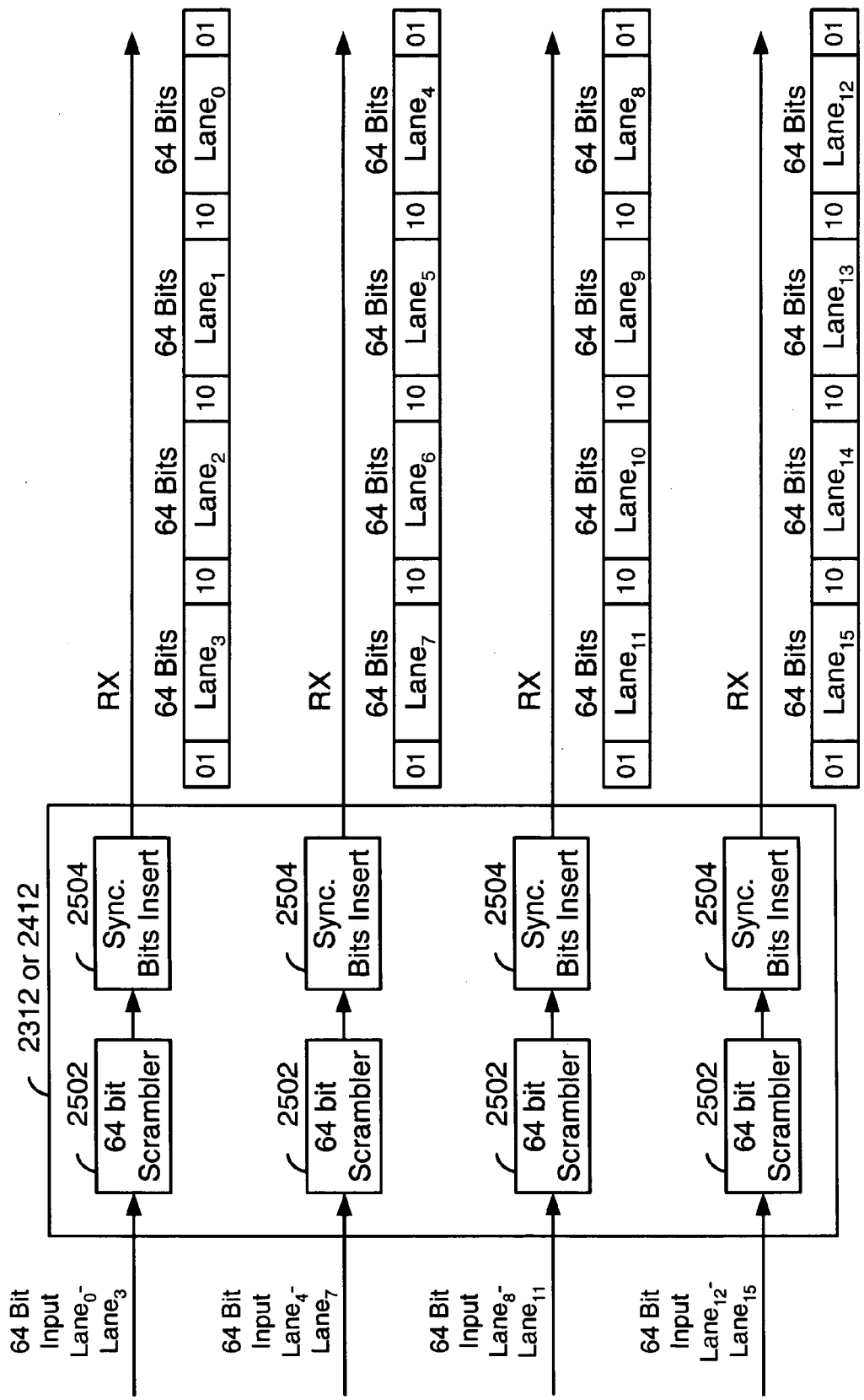
FIG. 25 is a block diagram illustrating operations of a receive lane synchronizer of the high-speed interface modules of FIGS. 23 and 24.

FIG. 25 is a block diagram illustrating operations of a receive lane synchronizer of the high-speed interface modules of FIGS. 23 and 24. The receive lane synchronizer 2312/2412 includes a plurality of scramblers 2502 and a plurality of synchronization bit insertion blocks 2504. Each of the plurality of scramblers 2502 operates upon a received bit stream to scramble the bits carried thereon. When an integrated circuit interface serviced by the high-speed interface modules interfaces via sixteen (16) bit streams, $Lane_0$ through $Lane_{15}$, each scrambler 2502 of FIG. 25 services four lanes. Each set of four lanes is multiplexed into a single receive bit stream and scrambled by a servicing scrambler 2502. A respective synchronization bit insertion block 2504 then inserts synchronization bits into the receive bit stream. While FIG. 25 illustrates that two insertion bits surround each group of Lane bits, other structures/operations may employ differing manners of insertion of synchronization bits.

Figure 26:
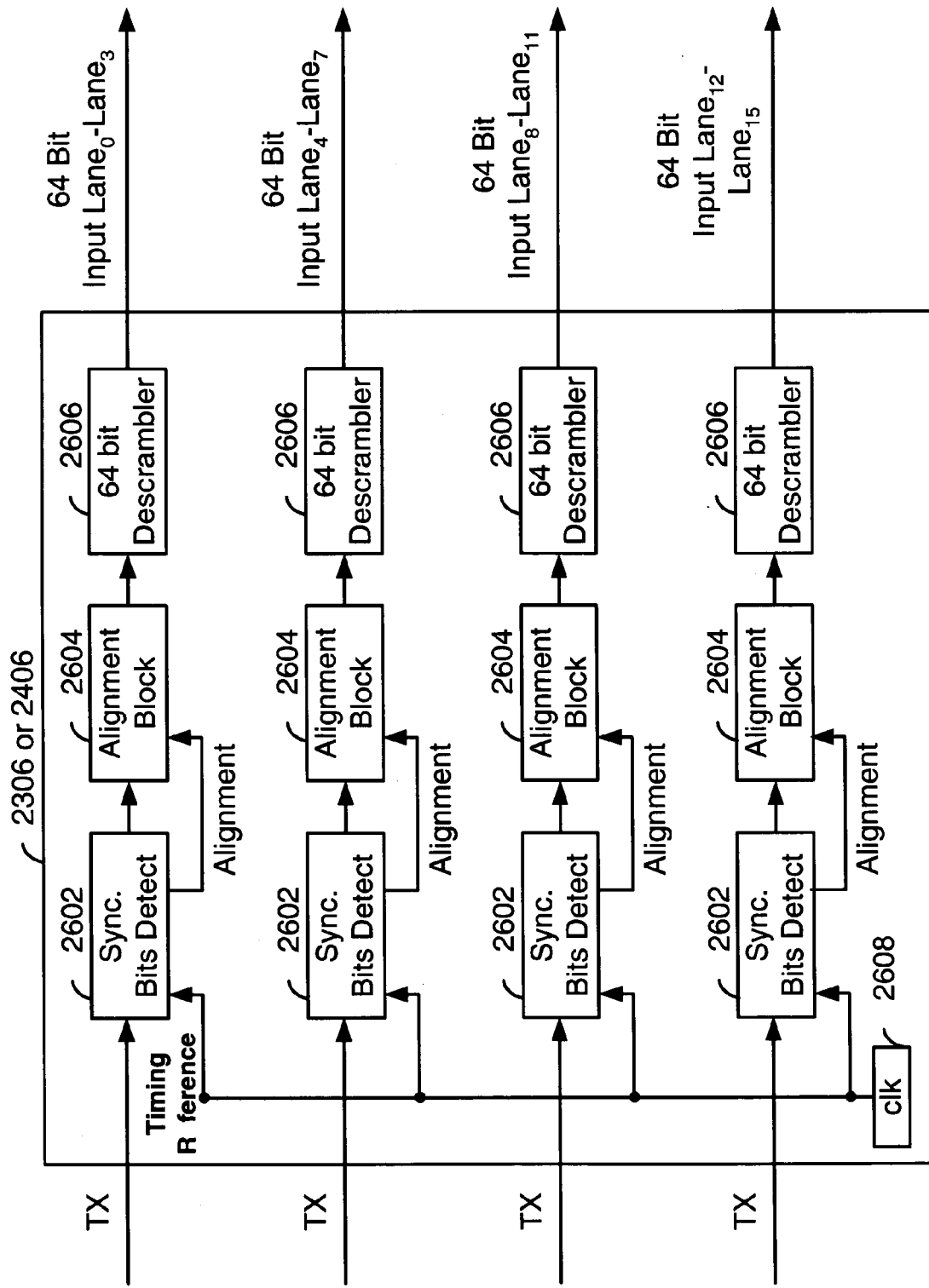
FIG. 26 is a block diagram illustrating receive operations of a transmit lane synchronizer of the high-speed interface modules of FIGS. 23 and 24.

FIG. 26 is a block diagram illustrating receive operations of a transmit lane synchronizer 2306 or 2406 of the high-speed interface modules of FIGS. 23 and 24. Synchronization bit detectors 2602 detect the synchronization bits that are inserted into the bit streams by a corresponding receive lane synchronizer 2504. Based upon a timing reference produced by a clock circuit 2608, the synchronization bit detectors 2602 produce alignment signals to alignment blocks 2604. Based upon the alignments signals, the alignment blocks 2604 align their respective serviced bit streams. The outputs of alignment blocks 2604 are produced to descramblers 2606 that descramble the serviced bit streams.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A high-speed serial bit stream interface module comprising:
   a line side interface that services a line side media, that receives a line side receive signal, and that transmits a line side transmit signal;
   a board side interface that services a plurality of transmit bit streams and a plurality of receive bit streams;
   at least one multiplexer that multiplexes the plurality of transmit bit streams to produce the line side transmit signal;
   at least one demultiplexer that demultiplexes the line side receive signal to produce the plurality of receive bit streams; and
   a plurality of signal conditioning circuits, each of which services a respective bit stream of the plurality of transmit bit streams and the plurality of receive bit streams.

2. The high-speed serial bit stream interface module of claim 1, wherein each of the plurality of signal conditioning circuits spectrally shapes its serviced bit stream.

3. The high-speed serial bit stream interface module of claim 2, wherein the plurality of signal conditioning circuits spectrally shape their respective bit streams to remove deterministic jitter.

4. The high-speed serial bit stream interface module of claim 2, wherein the plurality of signal conditioning circuits spectrally shape their respective bit streams to remove inter symbol interference.

5. The high-speed serial bit stream interface of claim 1, wherein each of the plurality of signal conditioning circuits comprises:
   a limiting amplifier that receives a serviced signal and that amplifies the serviced signal to produce the serviced signal in a desired output range;
   a clock and data recovery circuit having an adjustable Phase Locked Loop (PLL) bandwidth that communicatively couples to the output of the limiting amplifier and that receives, recovers, and reclocks the serviced signal; and
   wherein the PLL bandwidth of the clock and data recovery circuit is controllable to correspond to the signal characteristics of the serviced signal.

6. The high-speed serial bit stream interface of claim 5, wherein:
   the PLL bandwidth of signal conditioning circuits servicing transmit signals is based upon output characteristics of a device producing the transmit signals to the board side interface; and the PLL bandwidth of signal conditioning circuits servicing receive signals is based upon output characteristics of a device producing the receive signals to the line side interface.

7. The high-speed serial bit stream interface of claim 5, wherein the signal conditioning circuits each further comprise:
an output pre-emphasis circuit communicatively coupled to the output of the clock and data recovery circuit that controllably modifies the spectrum of the serviced signal to pre-compensate for spectral characteristics of a signal path upon which the serviced signal will be output.

8. The high-speed serial bit stream interface of claim 5, wherein the signal conditioning circuits each further comprise:
an equalizer communicatively coupled to the output of the limiting amplifier that controllably spectrally shapes the serviced signal to compensate for spectral characteristics of a signal path from which the serviced signal was received.

9. The high-speed serial bit stream interface of claim 5, wherein the signal conditioning circuits each further comprise:
a limiting amplifier that receives the serviced signal and that controllably amplifies the serviced signal to produce the serviced signal in a desired output range.

10. The high-speed serial bit stream interface of claim 1, further comprising:
a receive lane synchronizer that services the plurality of receive bit streams; and
a transmit lane synchronizer that services the plurality of transmit bit streams.

11. The high-speed serial bit stream interface of claim 10, wherein:
the receive lane synchronizer operates by inserting at least one bit pattern into the plurality of receive bit streams; and
the transmit lane synchronizer operates by inspecting at least one bit pattern contained in the plurality of transmit bit streams and realigning the plurality of transmit bit streams when required as determined by the inspection.

12. The high-speed serial bit stream interface of claim 1, further comprising:
a receive Forward Error Correction (FEC) block that services the plurality of receive bit streams; and
a transmit FEC block that services the plurality of transmit bit streams.

13. A high-speed serial bit stream interface module comprising:
a back plane/box interface that services a first plurality of transmit bit streams and a first plurality of receive bit streams;
a board side interface that services a second plurality of transmit bit streams and a second plurality of receive bit streams;
at least one demultiplexer that demultiplexes the first plurality of receive bit streams to produce the second plurality of receive bit streams;
at least one multiplexer that multiplexes the second plurality of transmit bit streams to produce the first plurality of transmit bit streams; and
a plurality of signal conditioning circuits, each of which services a respective bit stream of the first plurality of transmit bit streams and the first plurality of receive bit streams.

14. The high-speed serial bit stream interface module of claim 13, wherein each of the plurality of signal conditioning circuits spectrally shapes its serviced bit stream.

15. The high-speed serial bit stream interface module of claim 14, wherein the plurality of signal conditioning circuits spectrally shape their respective bit streams to remove deterministic jitter.

16. The high-speed serial bit stream interface module of claim 14, wherein the plurality of signal conditioning circuits spectrally shape their respective bit streams to remove inter symbol interference.

17. The high-speed serial bit stream interface of claim 13, wherein each of the plurality of signal conditioning circuits comprises:
a limiting amplifier that receives a serviced signal and that amplifies the serviced signal to produce the serviced signal in a desired output range;
a clock and data recovery circuit having an adjustable Phase Locked Loop (PLL) bandwidth that communicatively couples to the output of the limiting amplifier and that receives, recovers, and reclocks the serviced signal; and
wherein the PLL bandwidth of the clock and data recovery circuit is controllable to correspond to; the signal characteristics of the serviced signal.

18. The high-speed serial bit stream interface of claim 17, wherein:
the PLL bandwidth of signal conditioning circuits servicing transmit signals is based upon output characteristics of a device producing the transmit signals to the board side interface; and
the PLL bandwidth of signal conditioning circuits servicing receive signals is based upon output characteristics of a device producing the receive signals to the line side interface.

19. The high-speed serial bit stream interface of claim 17, wherein the signal conditioning circuits each further comprise:
an output pre-emphasis circuit communicatively coupled to the output of the clock and data recovery circuit that controllably modifies the spectrum of the serviced signal to pre-compensate for spectral characteristics of a signal path upon which the serviced signal will be output.

20. The high-speed serial bit stream interface of claim 17, wherein the signal conditioning circuits each further comprise:
an equalizer communicatively coupled to the output of the limiting amplifier that controllably spectrally shapes the serviced signal to compensate for spectral characteristics of a signal path from which the serviced signal was received.

21. The high-speed serial bit stream interface of claim 17, wherein the signal conditioning circuits each further comprise:
a limiting amplifier that receives the serviced signal and that controllably amplifies the serviced signal to produce the serviced signal in a desired output range.

22. The high-speed serial bit stream interface of claim 13, further comprising:
a receive lane synchronizer that services the first plurality of receive bit streams; and
a transmit lane synchronizer that services the first plurality of transmit bit streams.

23. The high-speed serial bit stream interface of claim 22, wherein:

the receive lane synchronizer operates by inserting at least one bit pattern into the first plurality of transmit bit streams; and the transmit lane synchronizer operates by inspecting at least one bit pattern contained in the first plurality of transmit bit streams and realigning the first plurality of transmit bit streams when required as determined by the inspection.

24. The high-speed serial bit stream. interface of claim 14, further comprising:
   a receive Forward Error Correction (FEC) block that services the first plurality of receive bit streams; and
   a transmit FEC block that services the first plurality of transmit bit streams.

\* \* \* \* \*